(12) United States Patent
Su et al.

(10) Patent No.: US 10,008,460 B2
(45) Date of Patent: Jun. 26, 2018

(54) SEMICONDUCTOR PACKAGE AND METHOD OF FORMING THE SAME

(71) Applicant: Taiwan Semiconductor Manufacturing Company Limited, Hsinchu (TW)

(72) Inventors: An-Jhih Su, Taoyuan County (TW); Hsien-Wei Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days. days.

(21) Appl. No.: 15/299,525

(22) Filed: Oct. 21, 2016

(65) Prior Publication Data

US 2017/0040271 A1 Feb. 9, 2017

Related U.S. Application Data

(60) Division of application No. 14/723,552, filed on May 28, 2015, now Pat. No. 9,478,443, which is a
(Continued)

(51) Int. Cl.
*H01L 21/00* (2006.01)
*H01L 23/00* (2006.01)
(Continued)

(52) U.S. Cl.
CPC ........ *H01L 24/03* (2013.01); *H01L 21/31053* (2013.01); *H01L 21/4853* (2013.01); *H01L 21/563* (2013.01); *H01L 21/565* (2013.01); *H01L 23/3128* (2013.01); *H01L 23/49811* (2013.01); *H01L 23/49816* (2013.01); *H01L 23/49838* (2013.01); *H01L 23/5389* (2013.01);
(Continued)

(58) Field of Classification Search
CPC . H01L 2924/00014; H01L 2224/48227; H01L 2224/73265; H01L 2924/00012; H01L 2924/00; H01L 2224/32225; H01L 2924/181; H01L 2224/32145; H01L 2224/97; H01L 2224/48091; H01L 2924/014; H01L 2224/16225; H01L 2924/12042; H01L 2924/15311; H01L 2224/73204; H01L 2224/13147
See application file for complete search history.

(56) References Cited

U.S. PATENT DOCUMENTS

2005/0012195 A1* 1/2005 Go .................. H01L 23/3128
257/686
2005/0012208 A1 1/2005 Jang et al.
(Continued)

FOREIGN PATENT DOCUMENTS

CN 102420180 4/2012

OTHER PUBLICATIONS

Chines Office Action; Application No. 201510514578.3; dated Jul. 27, 2017.

*Primary Examiner* — Robert Bachner
(74) *Attorney, Agent, or Firm* — Jones Day

(57) ABSTRACT

According to an exemplary embodiment, a semiconductor package is provided. The semiconductor package includes: a chip having a plurality of joint pads; a component having a plurality of metal caps on one side and having a grinded surface on the other side, wherein the metal caps are in contact with the joint pads of the chip.

20 Claims, 35 Drawing Sheets

Related U.S. Application Data continuation-in-part of application No. 14/470,999, filed on Aug. 28, 2014, now Pat. No. 9,502,364.

(51) Int. Cl.
| | |
|---|---|
| *H01L 21/56* | (2006.01) |
| *H01L 25/065* | (2006.01) |
| *H01L 25/10* | (2006.01) |
| *H01L 25/00* | (2006.01) |
| *H01L 23/498* | (2006.01) |
| *H01L 23/31* | (2006.01) |
| *H01L 21/3105* | (2006.01) |
| H01L 25/16 | (2006.01) |
| H01L 23/50 | (2006.01) |
| H01L 21/48 | (2006.01) |
| H01L 23/538 | (2006.01) |

(52) U.S. Cl.
CPC .............. *H01L 24/09* (2013.01); *H01L 24/11* (2013.01); *H01L 24/17* (2013.01); *H01L 24/19* (2013.01); *H01L 25/0657* (2013.01); *H01L 25/105* (2013.01); *H01L 25/50* (2013.01); H01L 21/486 (2013.01); H01L 23/49822 (2013.01); H01L 23/50 (2013.01); H01L 23/5383 (2013.01); H01L 25/16 (2013.01); H01L 2224/01 (2013.01); H01L 2224/0401 (2013.01); H01L 2224/04042 (2013.01); H01L 2224/04105 (2013.01); H01L 2224/12105 (2013.01); H01L 2224/16265 (2013.01); H01L 2224/19 (2013.01); H01L 2224/32145 (2013.01); H01L 2224/32225 (2013.01); H01L 2224/32265 (2013.01); H01L 2224/48091 (2013.01); H01L 2224/73204 (2013.01); H01L 2224/73209 (2013.01); H01L 2224/73217 (2013.01); H01L 2224/73265 (2013.01); H01L 2224/73267 (2013.01); H01L 2224/81005 (2013.01); H01L 2224/83005 (2013.01); H01L 2224/92124 (2013.01); H01L 2224/92244 (2013.01); H01L 2225/0651 (2013.01); H01L 2225/06568 (2013.01); H01L 2225/1035 (2013.01); H01L 2225/1041 (2013.01); H01L 2225/1058 (2013.01); H01L 2924/15311 (2013.01); H01L 2924/181 (2013.01); H01L 2924/19011 (2013.01); H01L 2924/19104 (2013.01); H01L 2924/19105 (2013.01)

(56) References Cited

U.S. PATENT DOCUMENTS

| | | | |
|---|---|---|---|
| 2007/0096249 A1* | 5/2007 | Roeper | ................ H01L 23/147 257/528 |
| 2007/0207577 A1 | 9/2007 | Oyu | |
| 2009/0045512 A1* | 2/2009 | Hedler | ................ H01L 21/486 257/738 |
| 2009/0294930 A1 | 12/2009 | Yoon et al. | |
| 2015/0200188 A1 | 7/2015 | Yu | |

* cited by examiner

900

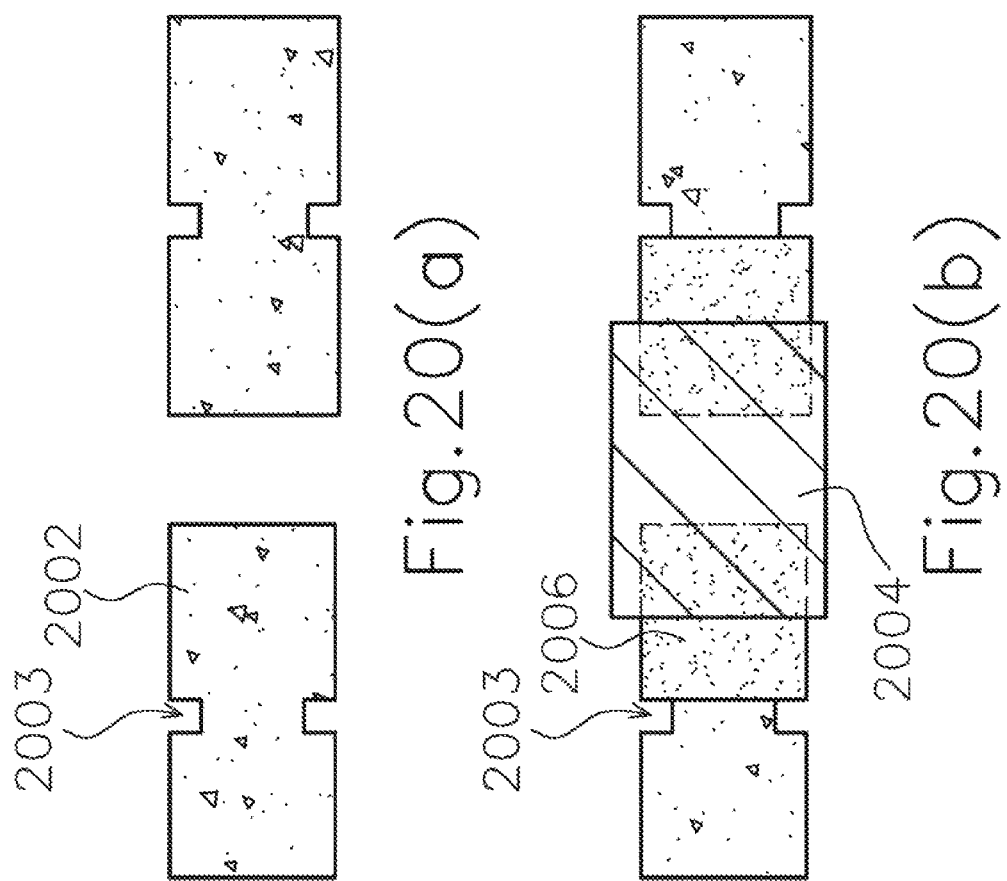

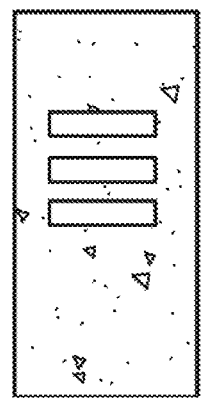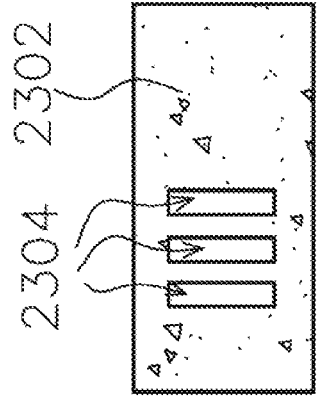
Fig.23
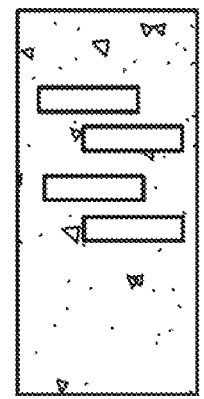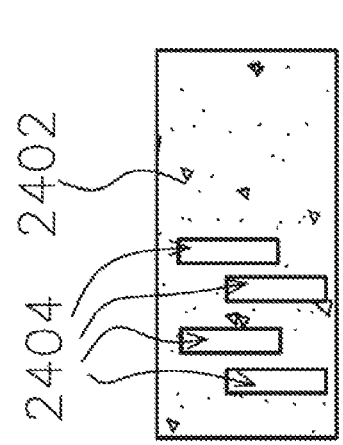
Fig.24

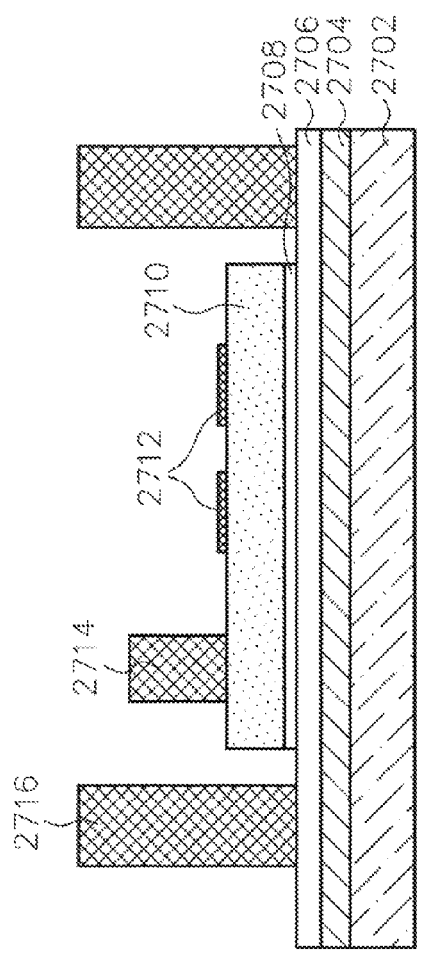
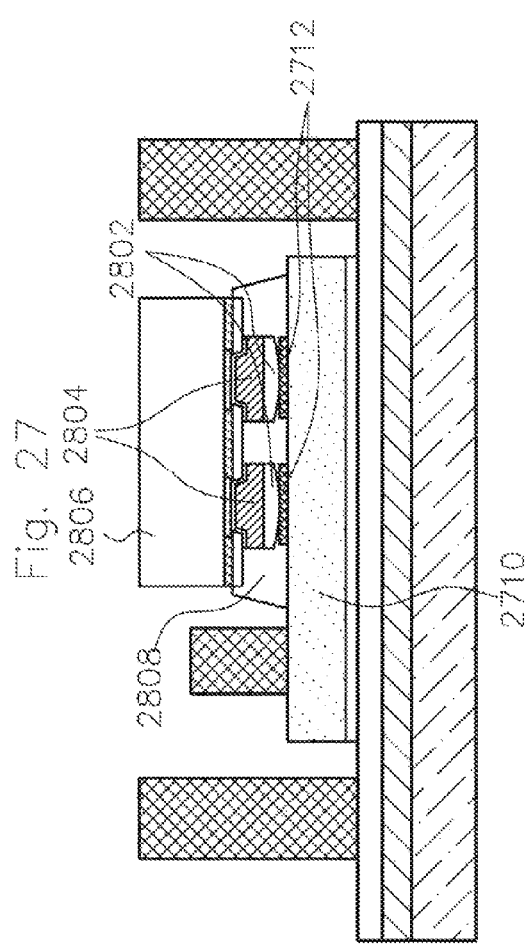

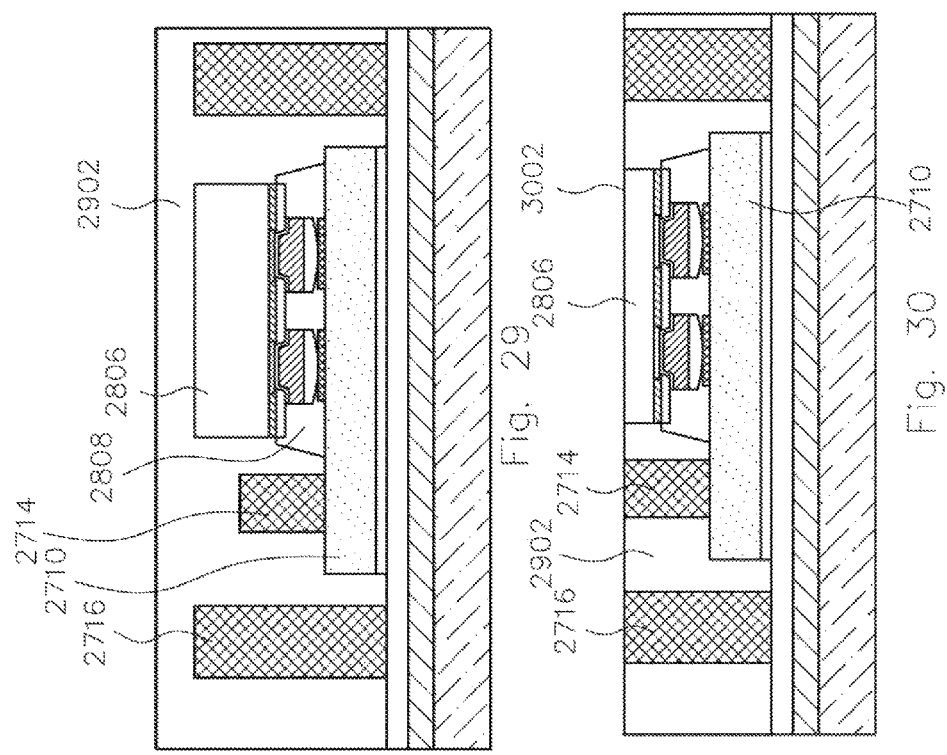

US 10,008,460 B2

SEMICONDUCTOR PACKAGE AND METHOD OF FORMING THE SAME

CROSS-REFERENCE TO RELATED APPLICATIONS

This application is a divisional application of U.S. patent application Ser. No. 14/723,552, entitled "Semiconductor Package and Method of Forming the Same," filed May 28, 2015, which is a continuation in-part of U.S. patent application Ser. No. 14/470,999, entitled "Semiconductor Package and Method of Forming the Same," filed Aug. 28, 2014, the disclosures of which are incorporated herein by reference in their entireties.

BACKGROUND

For mobile applications, a form factor refers to a mobile device's size, shape, and style, as well as the layout and position of the components. Consumers prefer devices with a thinner form factor, making manufacture of the device more difficult. Therefore, there is a need to meet the above demand.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a sectional view illustrating an exemplary semiconductor package in accordance with some embodiments.

FIGS. 20(*a*), 20(*b*) are top views illustrating the shape of the pad in the backside redistribution layer of the exemplary semiconductor package and its contact with the SMD component by using solders in accordance with some embodiments.

FIGS. 23, 24 are top views illustrating the shape of the pad in the backside redistribution layer of the exemplary semiconductor package in accordance with some embodiments.

FIGS. 27-32 are sectional views illustrating an exemplary semiconductor package in accordance with some embodiments.

DETAILED DESCRIPTION

Figure 1:
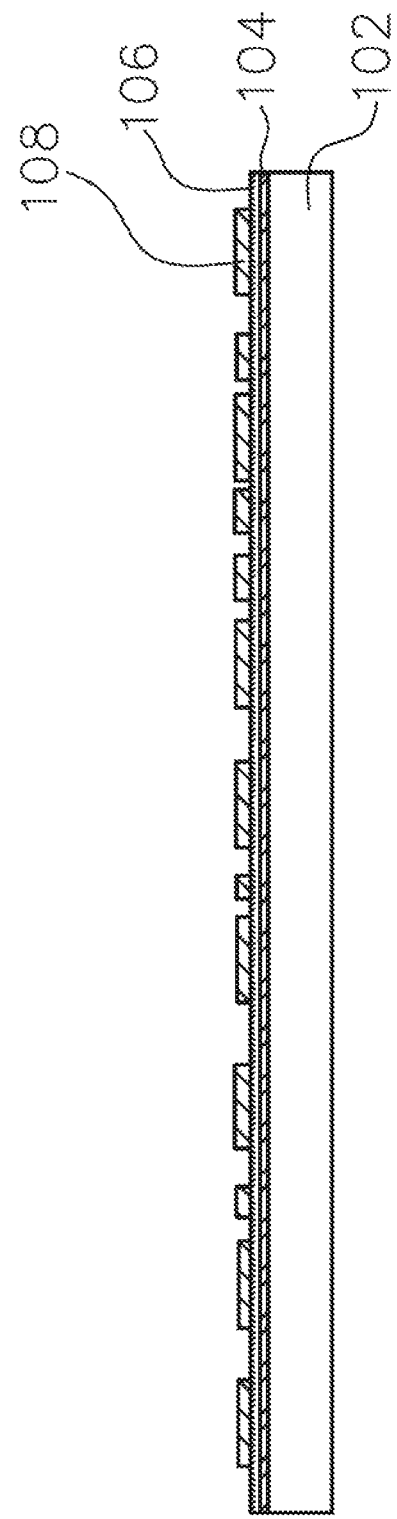
FIG. 1 is a sectional view illustrating an exemplary semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For mobile application, a form factor refers to a mobile device's size, shape, and style, as well as the layout and position of the components, such as embedded SMD components and chips. Consumers prefer devices with a thinner form factor, which makes manufacture of the devices more difficult.

The disclosure provides a novel package structure which integrates an integrated passive device (IPD) into an integrated fan-out (INFO) structure. Instead of picking and placing a thin IPD component (e.g., 50 micrometers) over a chip, the disclosure picks and places a thicker IPD component (e.g., 100 micrometers) over the chip and further grinds the IPD component to produce a thinner one (e.g., 50 micrometers). The disclosure overcomes the issue of handling the thin IPD component that is easily damaged during picking and placing. Additionally, short distance between the IPD component and the chip will result in better electric performance without reliability trade-off.

In order to reach the thinner package form factor without sacrificing signal integrity, the SMD components may be placed between the substrate (e.g., PCB) and the chips, and by the side of ball grid array ("BGA") balls. The distance therebetween is determined by the BGA balls. The SMD components should have a height which is less than a stand-off height of the BGA balls. In one embodiment, the height of the SMD components is about 130-150 micrometers; the height of the pre-solder is about 20 micrometers; and the stand-off-height of the BGA balls is about 140-170 micrometers. It has been demonstrated that the design margin for the placement of the SMD components is very tight. Therefore, to enlarge the design margin, this disclosure embeds the SMD in the molding.

In one embodiment, a new package structure is disclosed. Some pads of a backside redistribution layer (B/S RDL) in the package are designed with an open structure. By using the open structure, the molding material can flow into the space under the SMD component. The chip may be selected from the group consisting of silicon semiconductors or III-V semiconductors. The chips may include a microelectromechanical system (MEMS).

FIG. 1 is a sectional view illustrating an exemplary semiconductor package in accordance with some embodiments. As shown in FIG. 1, a temporary bonding layer 104 is coated over a carrier 102. The carrier 102 may be formed of, for example, metal or glass. The temporary bonding layer 104 is formed of, for example, glue.

An insulator layer 106 is formed over the temporary bonding layer 104. The insulator layer 106 may be formed of, for example, epoxy or polymer. A backside redistribution layer 108 is formed over the insulator layer 106, then, the backside redistribution layer 108 is patterned by using a mask (not shown). The material for the backside redistribution layer 108 may include, but is not limited to, for example, Cu, Al, AlCu, Al alloy, Cu alloy, or other conductive materials.

Figure 2:
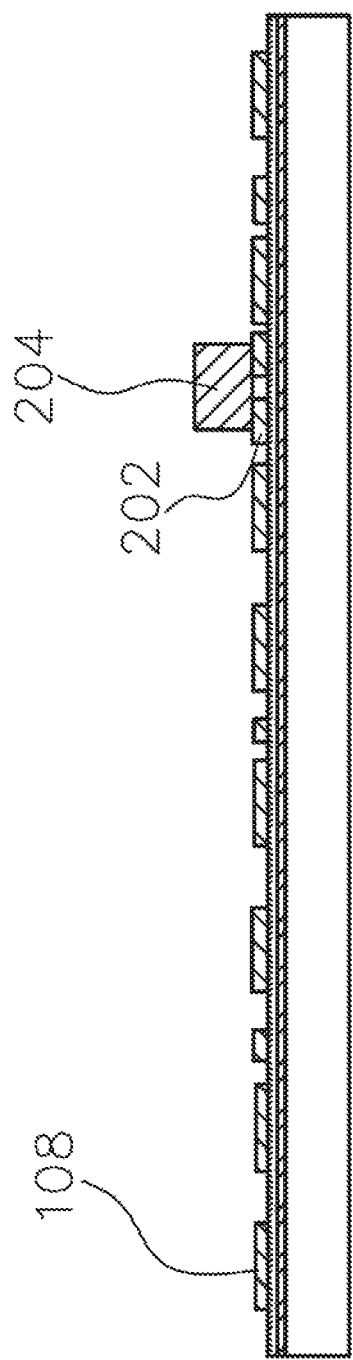
FIGS. 2-10 are sectional views illustrating the exemplary semiconductor package in accordance with some embodiments.

FIG. 2 is a sectional view illustrating the exemplary semiconductor package in accordance with some embodiments. As shown in FIG. 2, a pre-solder (not shown) is provided over a portion 202 of the backside redistribution layer 108. An SMD component 204 is provided over the backside redistribution layer 108. The pre-solder (not shown) is disposed between the SMD component 204 and the portion 202 of the backside redistribution layer 108. The SMD component 204 may be, for example, passive components, such as resistor, inductors, or capacitors.

Figure 3:
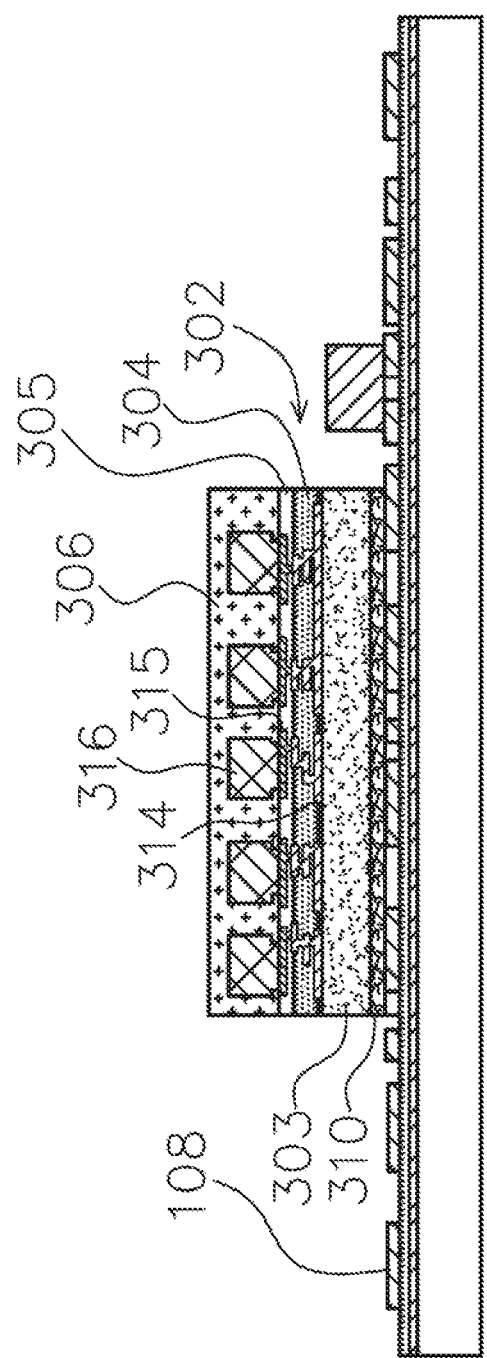
Figure 4:
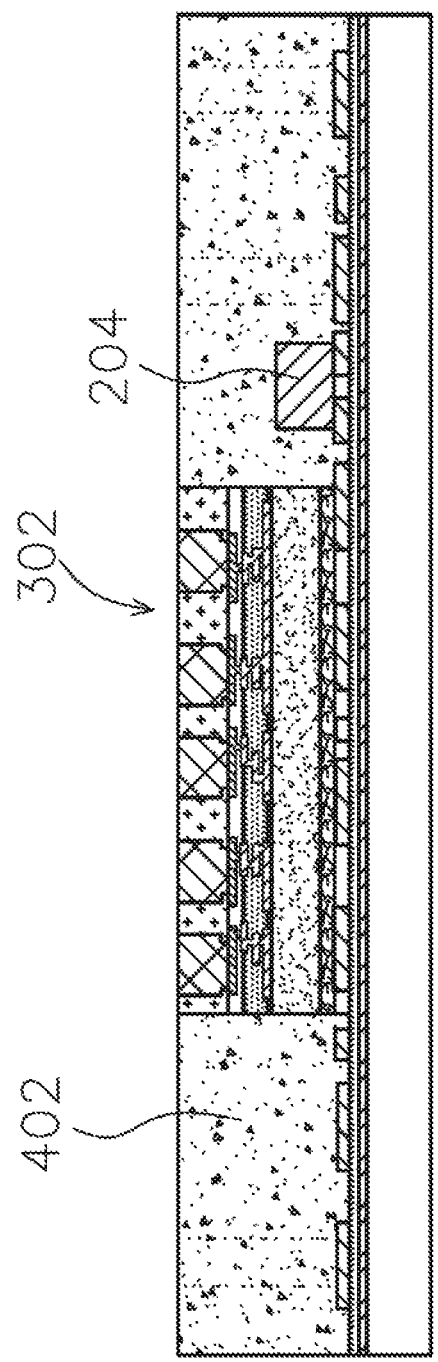

FIG. 3 is a sectional view illustrating the exemplary semiconductor package in accordance with some embodiments. As shown in FIG. 3, a chip 302 is provided over the backside redistribution layer 108. In details, the chip 302 adheres to the backside redistribution layer 108 by a glue layer 310. The chip 302 includes a die 303, an interconnect layer 304, a passivation layer 305, and a sacrificial layer 306. The interconnect layer 304 includes interconnections 314. The passivation layer 305 includes a pad 315. The sacrificial layer 306 includes a copper (Cu) pillar 316. The die 303 connects to the Cu pillar 316 through the interconnections 314 and the pad 315. The interconnect layer 304 may be made of low-k material. The sacrificial layer 306 may be made of polymer. In the embodiments, the chip 302 may be selected from the group consisting of silicon semiconductors or III-V semiconductors. The chips may include a microelectromechanical system (MEMS). FIG. 4 is a sectional view illustrating the exemplary semiconductor package in accordance with some embodiments. As shown in FIG. 4, a molding compound 402 is provided over the SMD component 204 and adjacent to the chip 302. The molding compound 402 may be made of silica, organic materials, or epoxy resins. The molding step may be performed to form the molding compound 402 surrounding the SMD component 204 and adjacent to the chip 302. The molding compound 402 may be partially removed from the top of the chip 302 to expose the upper surface of the chip 302.

Figure 5:
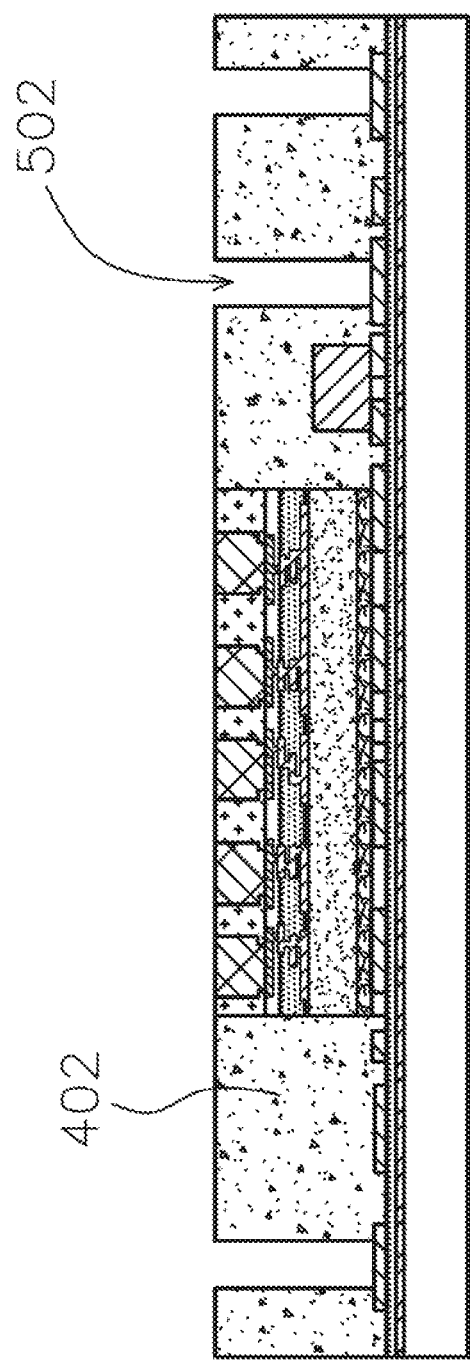

FIG. 5 is a sectional view illustrating the exemplary semiconductor package in accordance with some embodiments. As shown in FIG. 5, a via hole 502 is opened in the molding compound 402. In the embodiment, the via hole 502 exposes the backside redistribution layer 108.

Figure 6:
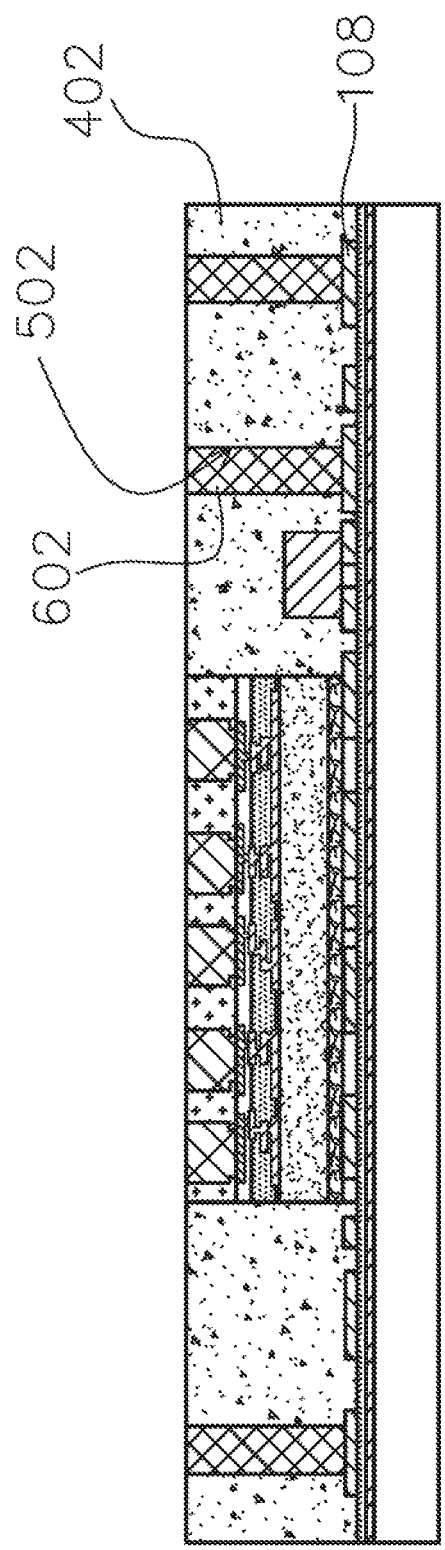

FIG. 6 is a sectional view illustrating the exemplary semiconductor package in accordance with some embodiments. As shown in FIG. 6, a via 602 is provided in the via hole 502 of the molding compound 402, and the via 602 electrically connects to the backside redistribution layer 108. The via 602 may be made of, for example, copper or tin. In the embodiment, the formation of the molding compound 402 and the via 602 includes: first forming the molding compound 402; opening the via hole 502 in the molding compound 402 to expose the backside redistribution layer 108; and then forming the via 602 in the via hole 502. In some embodiments, such formation may include: first forming the via 602; and then forming the molding compound 402. That is, the sequence of the formation of the molding compound 402 and the via 602 may alter.

Figure 7:
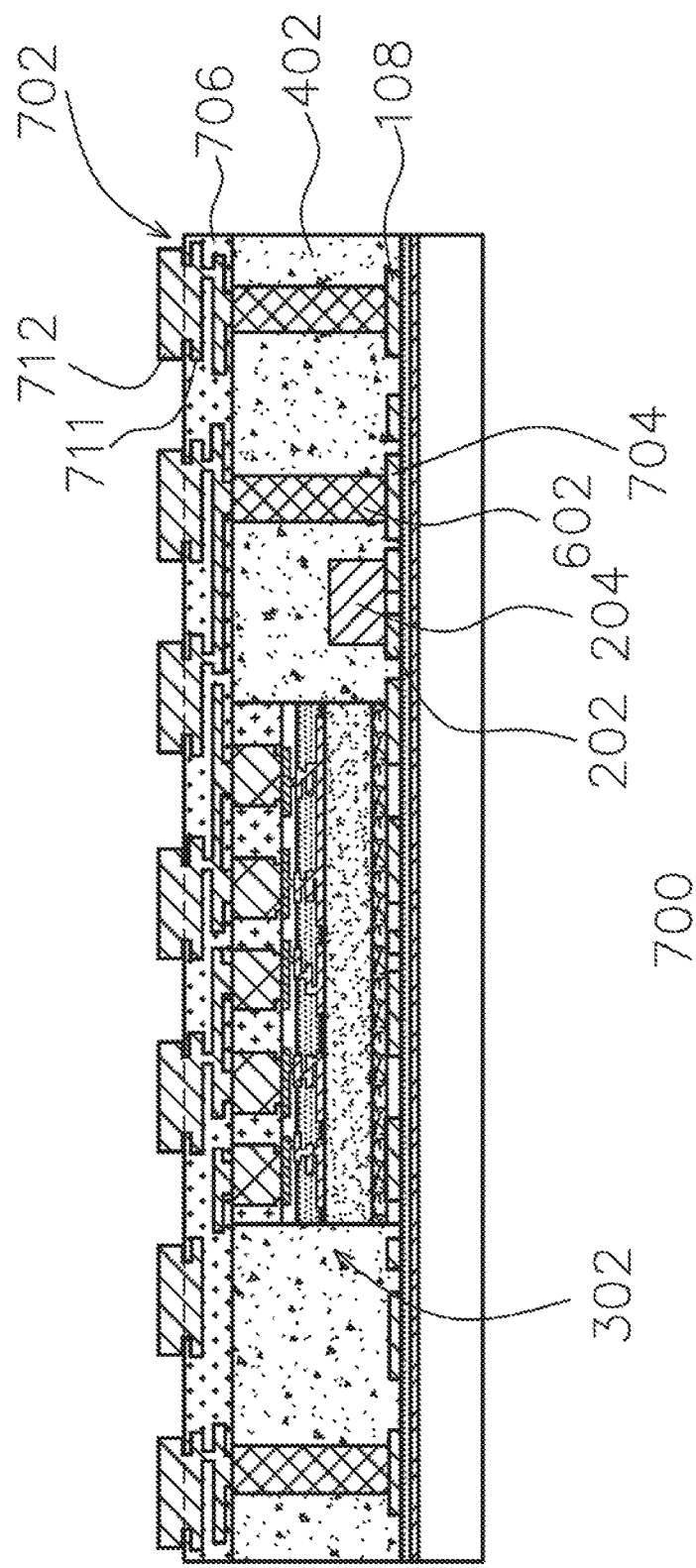

FIG. 7 is a sectional view illustrating the exemplary semiconductor package in accordance with some embodiments. As shown in FIG. 7, the portion 202 and the portion of 704 of the backside redistribution layer 108 are connected, then a front redistribution layer 702 is provided over the chip 302 and the via 602 to connect the chip 302 and the SMD component 204 by using the backside redistribution layer 108, the via 602, and the front redistribution layer 702. The front redistribution layer 702 surrounded by a polybenzoxazole (PBO) layer 706 may include a trace 711 and an under bump metal (UBM) 712. The end of the trace 711 may provide a landing pad (not shown).

The trace 711 and the PBO layer 706 can be either a single layer or stacked multiple layers. In the embodiment with the trace 711 and the PBO layer 706 having stacked multiple layers, the formation of the PBO layer 706 and the trace 711 may include: forming a first PBO layer over the chip 302 and the molding compound 402; etching the first PBO layer and forming a first trace layer in the etched portion; repeating the formation and the etching process; and forming the UBM 712 over the end of the trace 711 (landing pad). The material for the front redistribution layer 702 may comprise, but is not limited to, for example Cu, Al, AlCu, Al alloy, Cu alloy, or other conductive materials. As such, a semiconductor package 700 is provided. The SMD components 204 are placed in the molding compound 402 and are not placed between BGA balls. So the SMD components 204 are no longer constrained by a height which is less than the stand-off-height of the BGA balls. While having a thinner package form factor without sacrificing signal integrity, the design margin for placement of the SMD components 204 relaxes.

Figure 8:
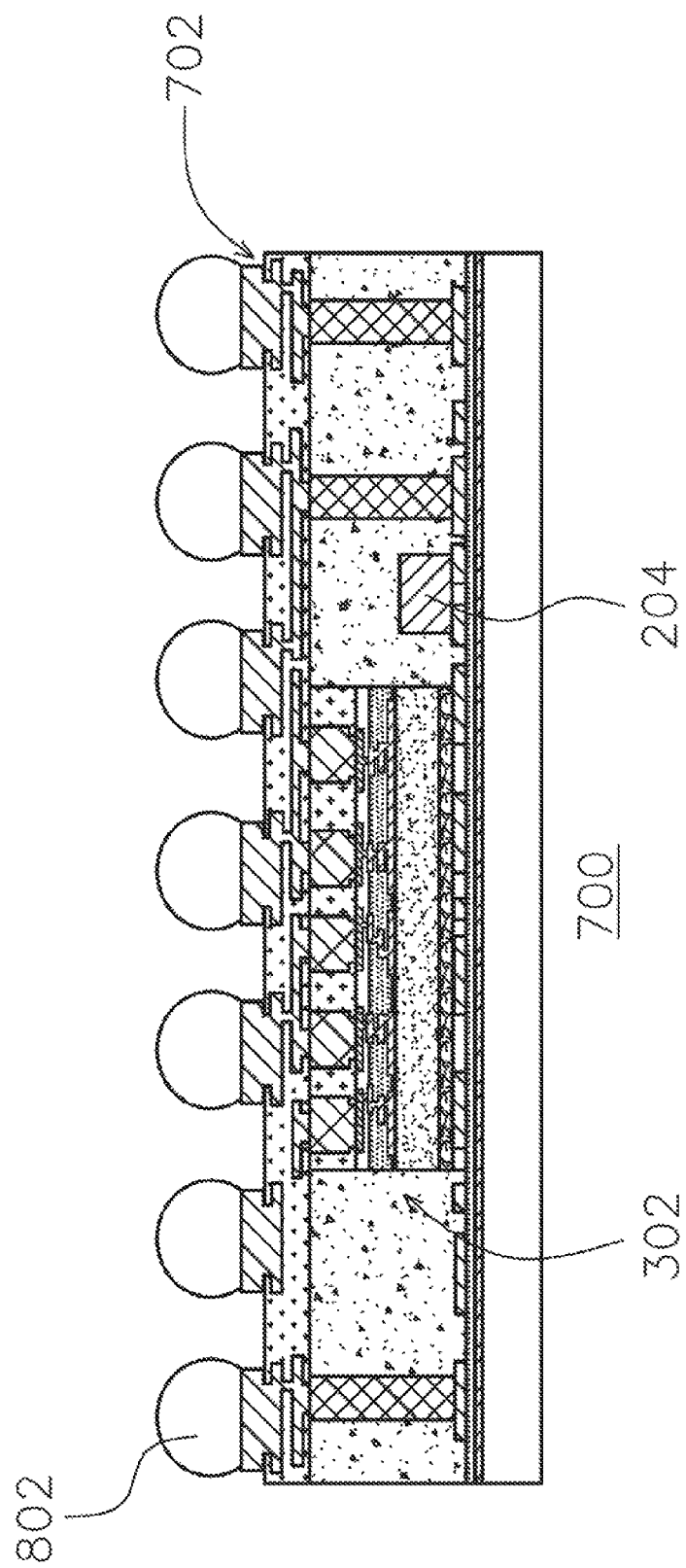

FIG. 8 is a sectional view illustrating the exemplary semiconductor package in accordance with some embodiments. As shown in FIG. 8, a plurality of metal bumps 802 are provided and connected to the chip 302 and the SMD component 204 by the front redistribution layer 702. The formation of the metal bumps 802 on the front redistribution layer 702 may be realized by, for example, ball grid array (BGA) solder bumping, which is a type of surface-mount packaging.

Figure 9:
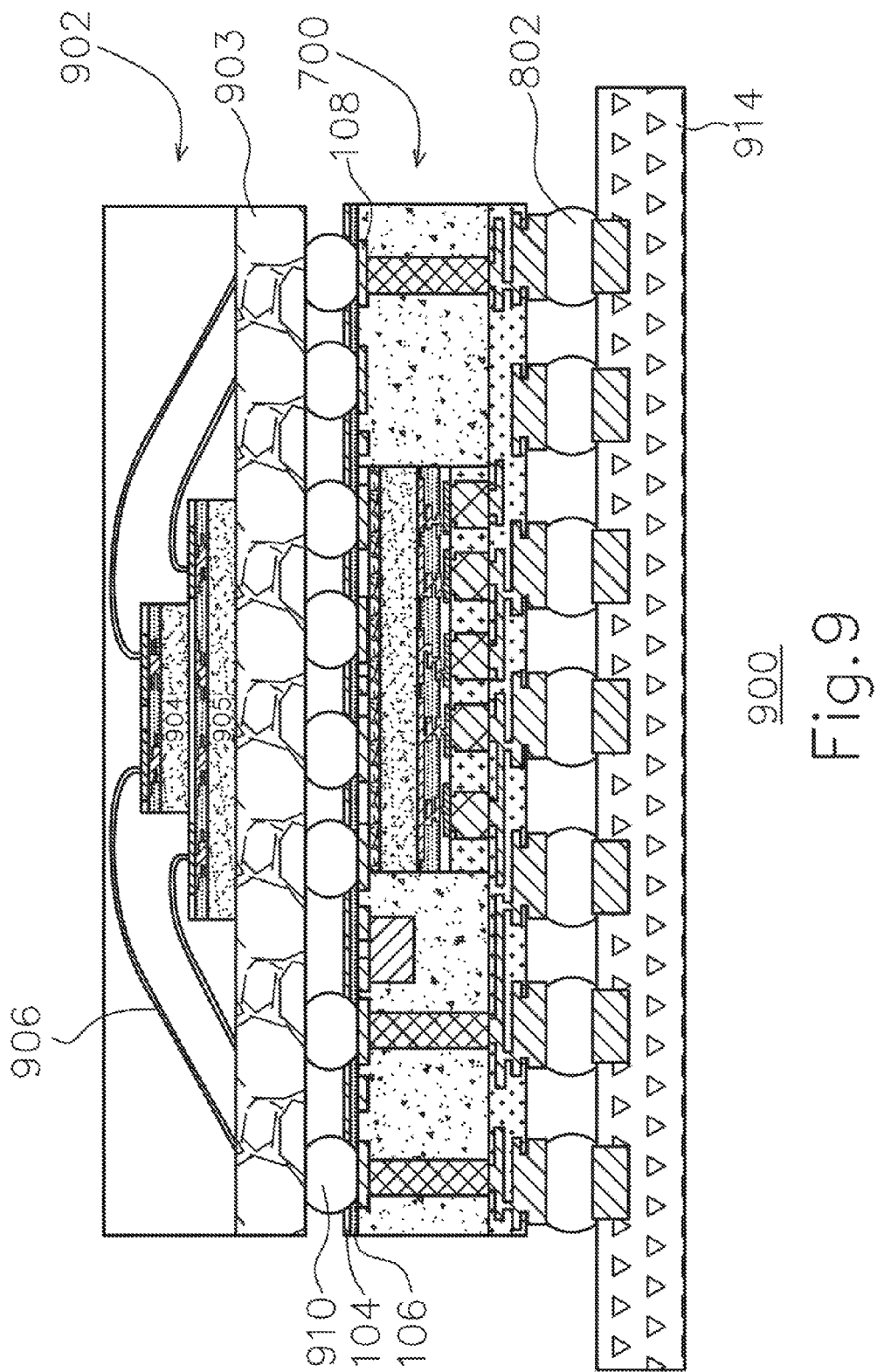

FIG. 9 is a sectional view illustrating the exemplary semiconductor device using the exemplary semiconductor package in accordance with some embodiments. As shown in FIG. 9, the semiconductor package 700 is debonded from the carrier 102. The insulator layer 106 and the temporary bonding layer 104 of the semiconductor package 700 are opened. The semiconductor package 700 is flipped upside down and connected to a printed circuit board 914.

In the embodiment, the semiconductor package 902 includes two stacked mobile DDRs (or LPDDR) 904, 905 and a packaging substrate 903. The packaging substrate 903 includes a redistribution layer (not shown) similar to the abovementioned, and connects to the two mobile DDRs 904, 905 through bonding wires 906. Metal bumps 910 provide electrical connection between the backside redistribution layer 108 and the packaging substrate 903. Therefore, the semiconductor package 902 is bonded to the backside redistribution layer of the semiconductor packages 700, so that a package-on-package structure 900 including the semiconductor packages 700, 902 is provided.

Figure 10:
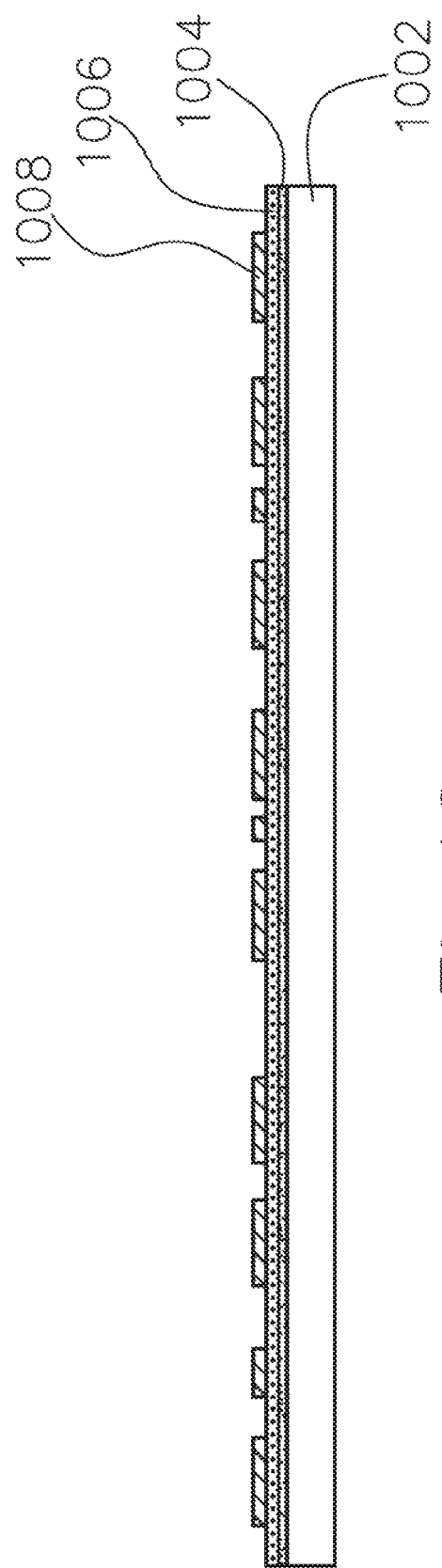

FIG. 10 is a sectional view illustrating an exemplary semiconductor package in accordance with some embodiments. As shown in FIG. 10, a temporary bonding layer 1004 is coated over a carrier 1002. The carrier 1002 may be formed of, for example, metal or glass. The temporary bonding layer 1004 is formed of, for example, glue.

A first insulator layer 1006 is formed over the temporary bonding layer 1004. The first insulator layer 1006 may be formed of, for example, epoxy or polymer. A backside redistribution layer 1008 is formed over the first insulator layer 1006, then, the backside redistribution layer 1008 is patterned by using a mask (not shown). The material for the backside redistribution layer 1008 may comprise, but is not limited to, for example Cu, Al, AlCu, Al alloy, Cu alloy, or other conductive materials.

Figure 11:
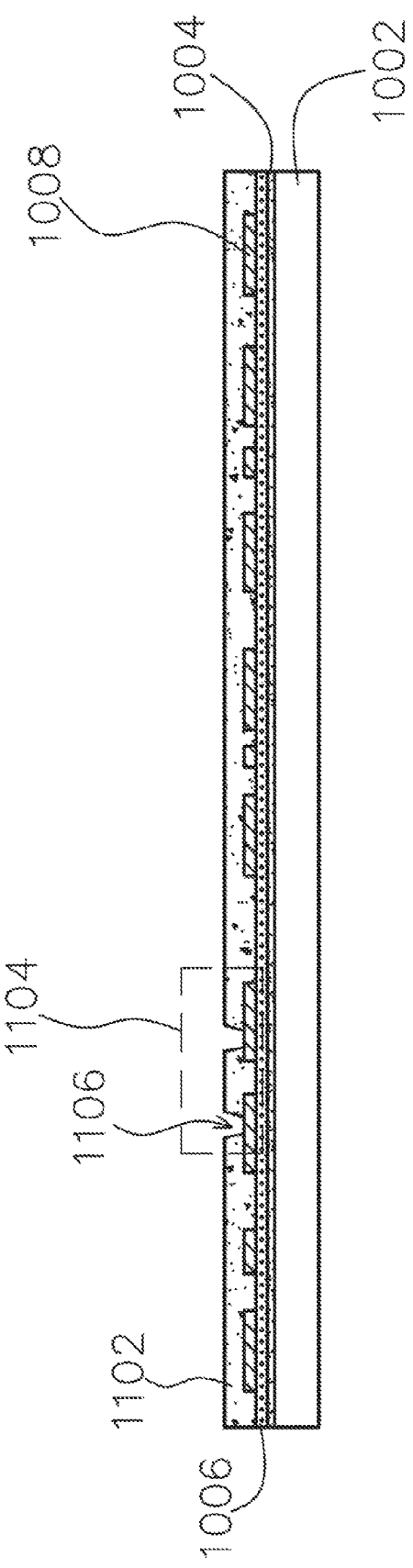
FIGS. 11-19 are sectional views illustrating the exemplary semiconductor package in accordance with some embodiments.

FIG. 11 is a sectional view illustrating the exemplary semiconductor package in accordance with some embodiments. As shown in FIG. 11, a second insulator layer 1102 is formed over the backside redistribution layer 1008 and the first insulator layer 1006. Then the second insulator layer 1102 is patterned to form a recess 1106 exposing a portion of the backside redistribution layer 1008. The second insulator layer 1102 may be formed of, for example, epoxy or polymer. A detail portion 1104 for solder wetting will be described.

Figure 12:
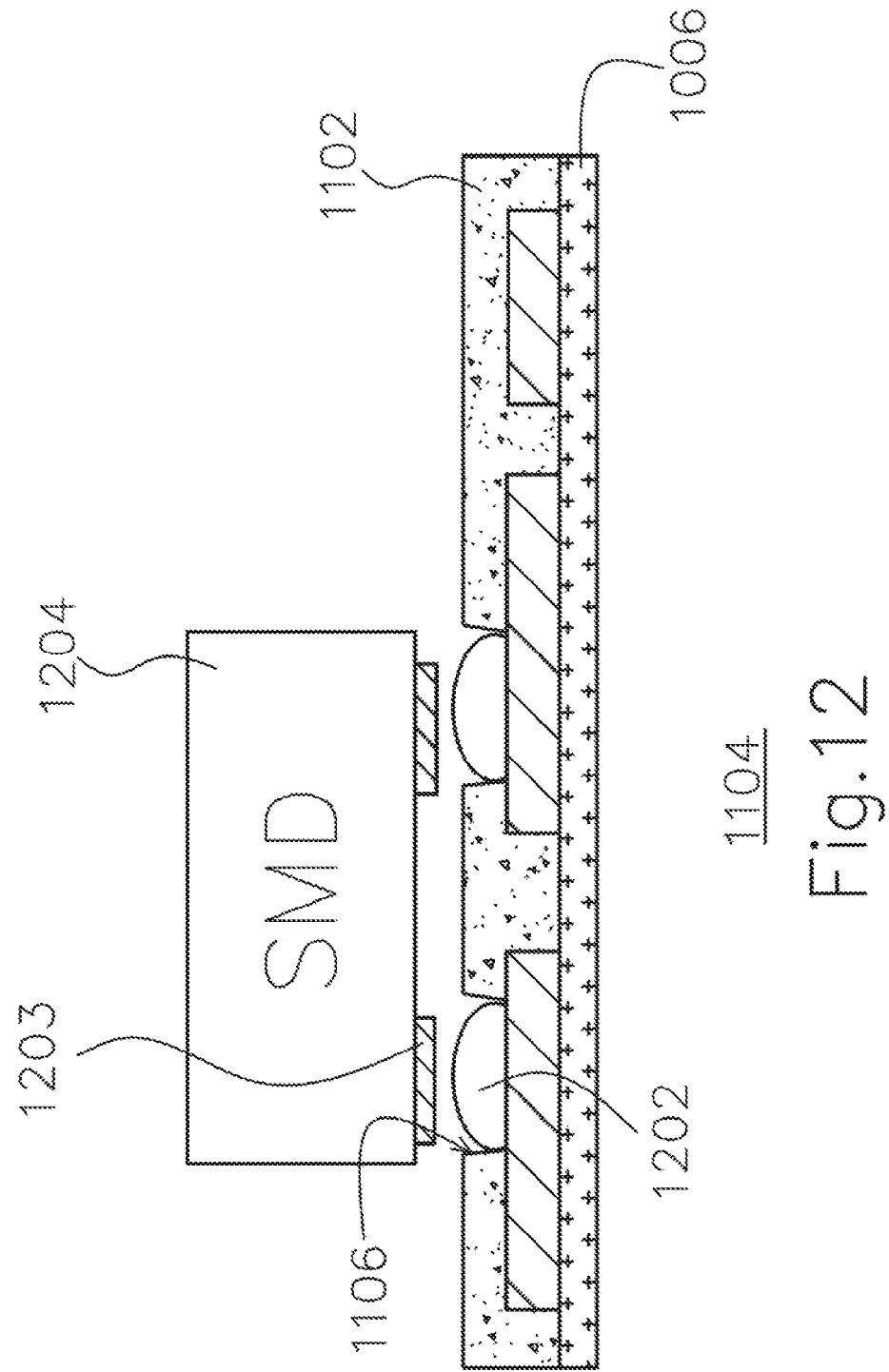

FIG. 12 is a sectional view illustrating detail portion 1104 of the exemplary semiconductor package in accordance with some embodiments. As shown in FIG. 12, a pre-solder 1202 is provided in the recess 1106 of the second insulator layer 1102. Another pre-solder 1203 is attached to the SMD component 1204.

Figure 13:
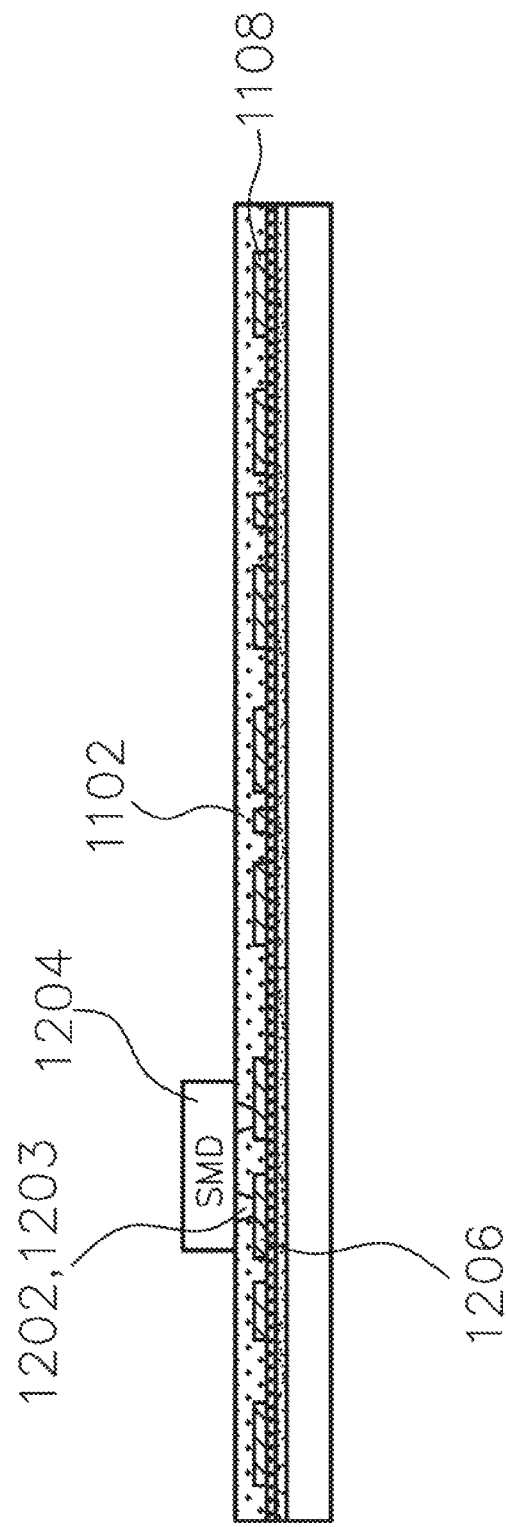

FIG. 13 is a sectional view illustrating the exemplary semiconductor package in accordance with some embodiments. As shown in FIG. 13, the pre-solders 1202, 1203 are combined to produce a solder joint and disposed between the SMD component 1204 and the portion 1206 of the backside redistribution layer 1008, so the SMD component 1204 contacts with the pre-solders 1202, 1203 in the recess of the second insulator layer 1102. The SMD component 1204 may be passive components, such as resistor, inductors or capacitors.

Figure 14:
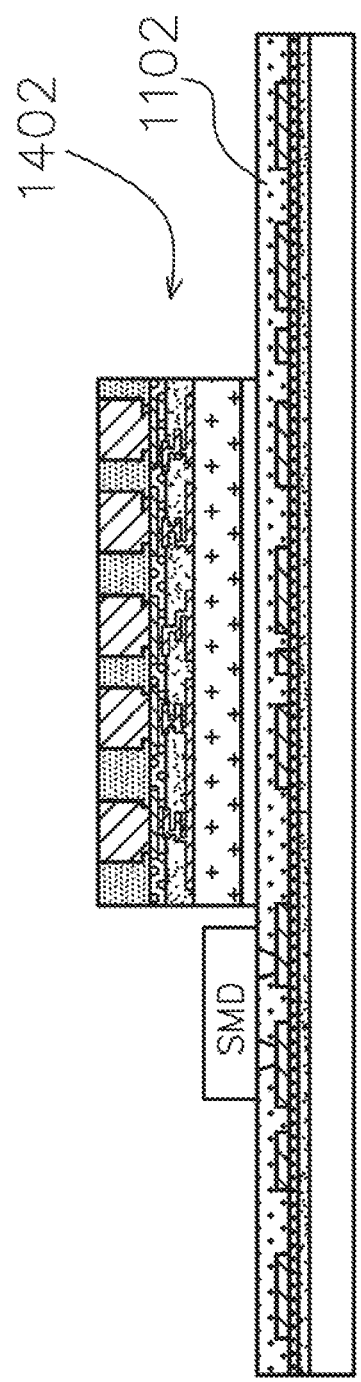

FIG. 14 is a sectional view illustrating the exemplary semiconductor package in accordance with some embodiments. As shown in FIG. 14, a chip 1402 is provided over the second insulator layer 1102. The chip 1402 may be selected from the group consisting of silicon semiconductors or III-V semiconductors. The chips may include a microelectromechanical system (MEMS).

Figure 15:
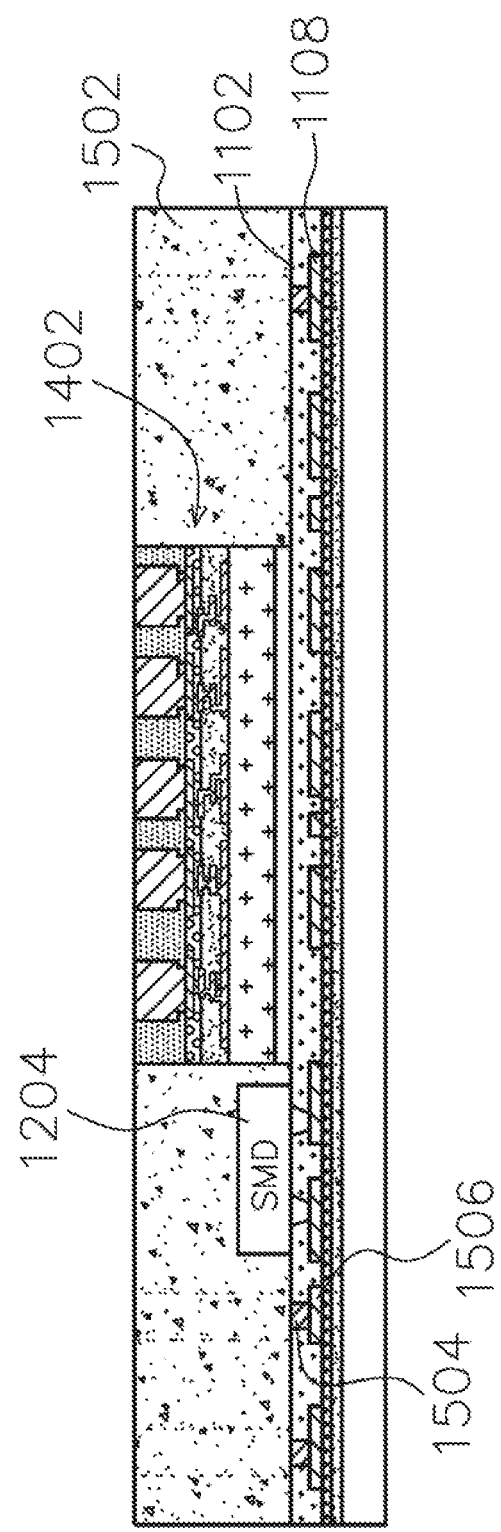

FIG. 15 is a sectional view illustrating the exemplary semiconductor package in accordance with some embodiments. As shown in FIG. 15, a molding compound 1502 is provided over the SMD component 1204 and adjacent to the chip 1402. The molding compound 1502 may be made of silica, organic materials, or epoxy resins. The molding step may be performed to form the molding compound 1502 surrounding the SMD component 1204 and adjacent to the chip 1402. The molding compound 1502 may be partially removed from the top of the chip 1402 to expose the upper surface of the chip 1402.

Before providing the molding compound 1502, a portion of the second insulator layer 1102 is removed to form a recess and to expose a portion 1506 of the backside redistribution layer 1008, and a conductive material 1504 is filled in the recess for further electrical connection.

Figure 16:
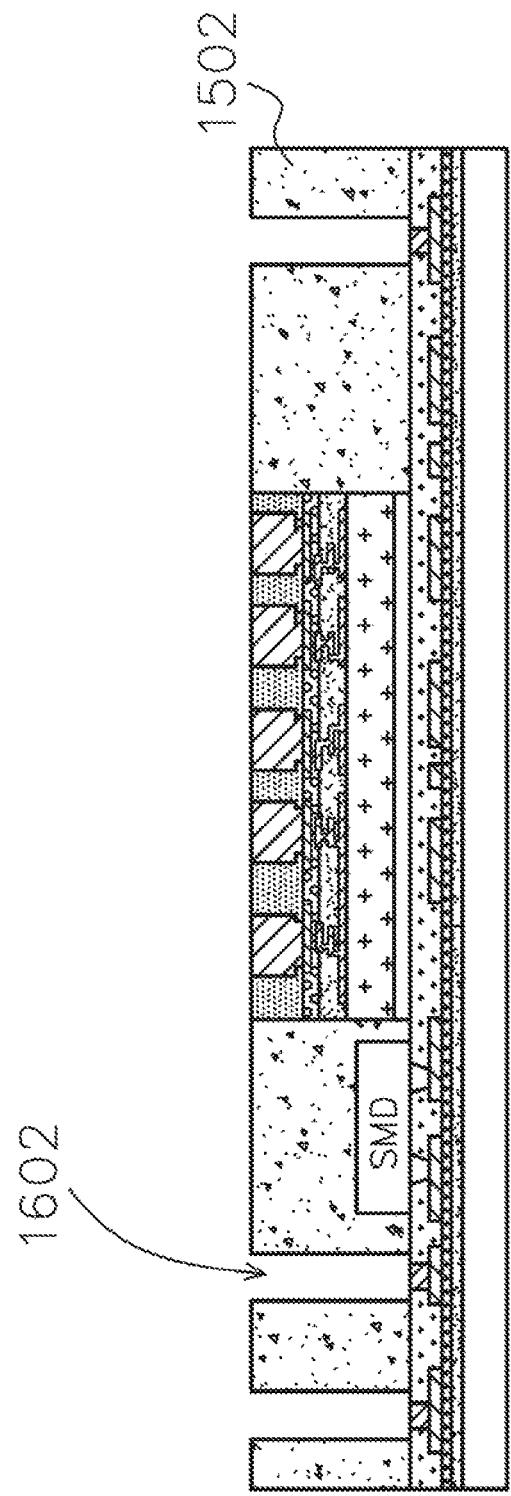

FIG. 16 is a sectional view illustrating the exemplary semiconductor package in accordance with some embodiments. As shown in FIG. 16, a via hole 1602 is opened in the molding compound 1502.

Figure 17:
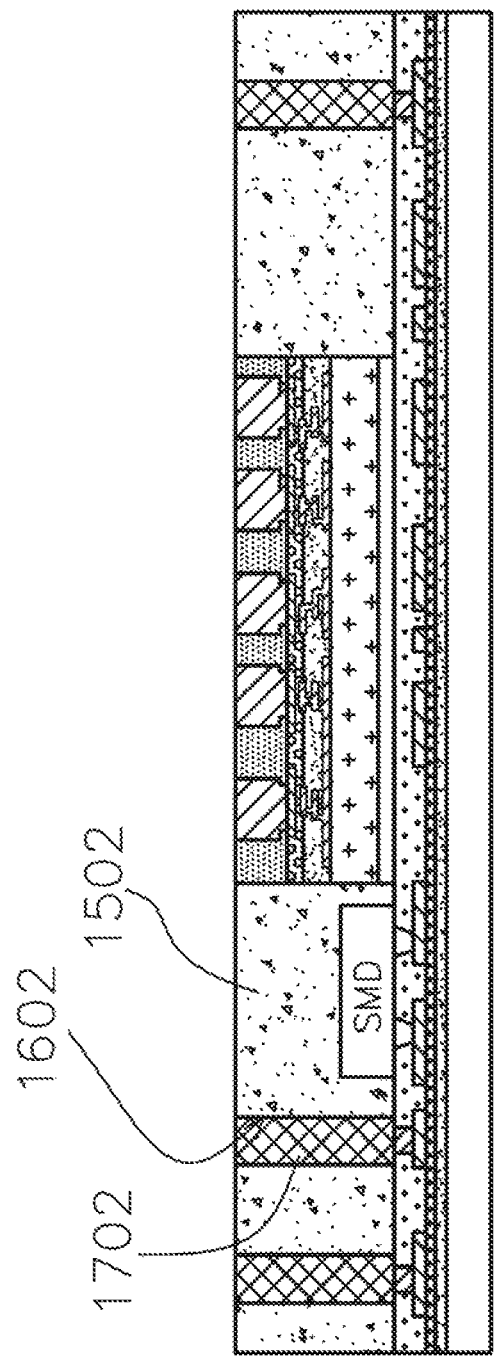

FIG. 17 is a sectional view illustrating the exemplary semiconductor package in accordance with some embodiments. As shown in FIG. 17, a via 1702 is provided in the via hole 1602 of the molding compound 1502.

Figure 18:
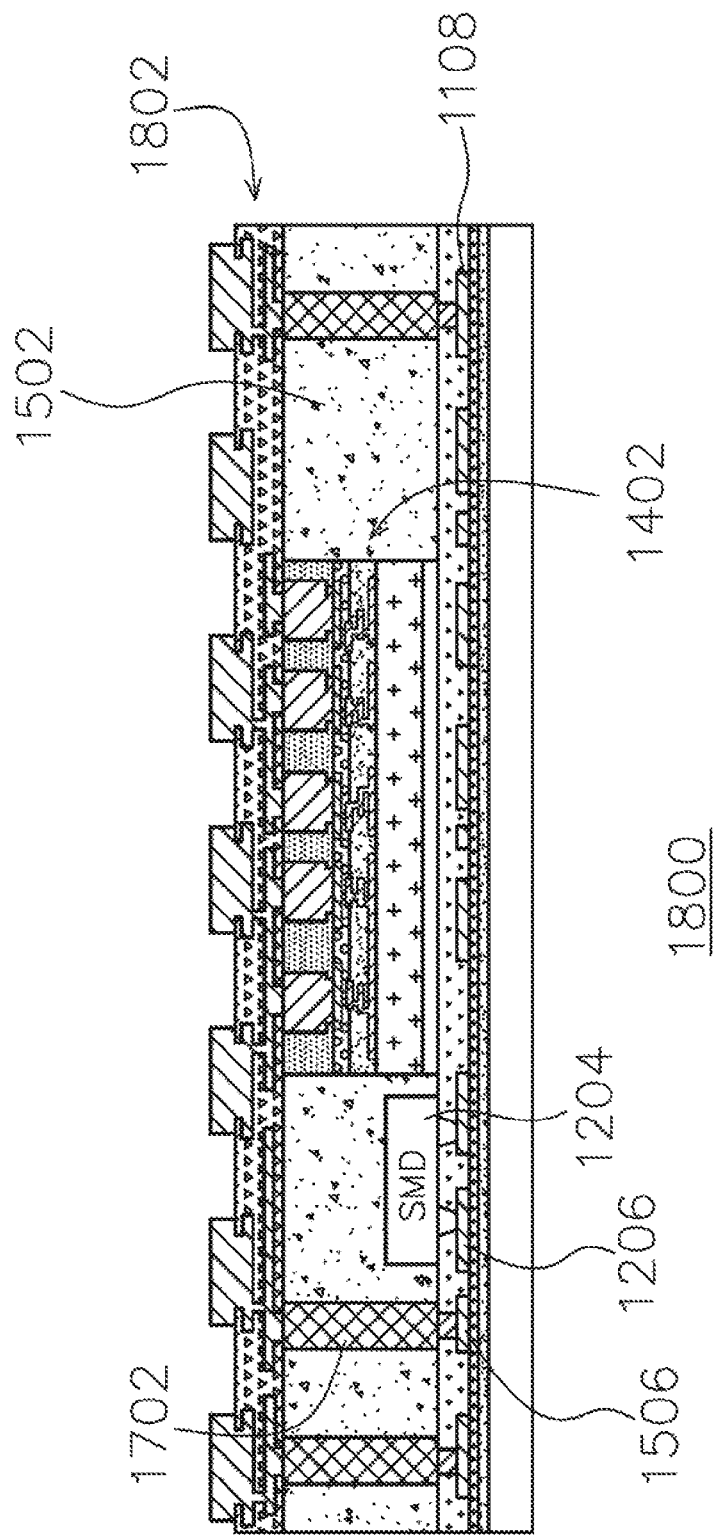

FIG. 18 is a sectional view illustrating the exemplary semiconductor package in accordance with some embodiments. As shown in FIG. 18, the portion 1206 and the portion of 1506 of the backside redistribution layer 1108 are connected, then a front redistribution layer 1802 is provided over the chip 1402 and the via 1702 to connect the chip 1402 and the SMD component 1204 by using the backside redistribution layer 1108, the via 1702, and the front redistribution layer 1802. The material for the front redistribution layer 1802 may comprise, but is not limited to, for example Cu, Al, AlCu, Al alloy, Cu alloy, or other conductive materials. As such, a semiconductor package 1800 is provided.

The SMD components 1204 are placed in the molding compound 1502 and are not placed between BGA balls. So the SMD components 1204 are no longer constrained by a height which is less than the stand-off-height of the BGA balls. While having a thinner package form factor without sacrificing signal integrity, the design margin for placement of the SMD components 1204 relaxes.

Figure 19:
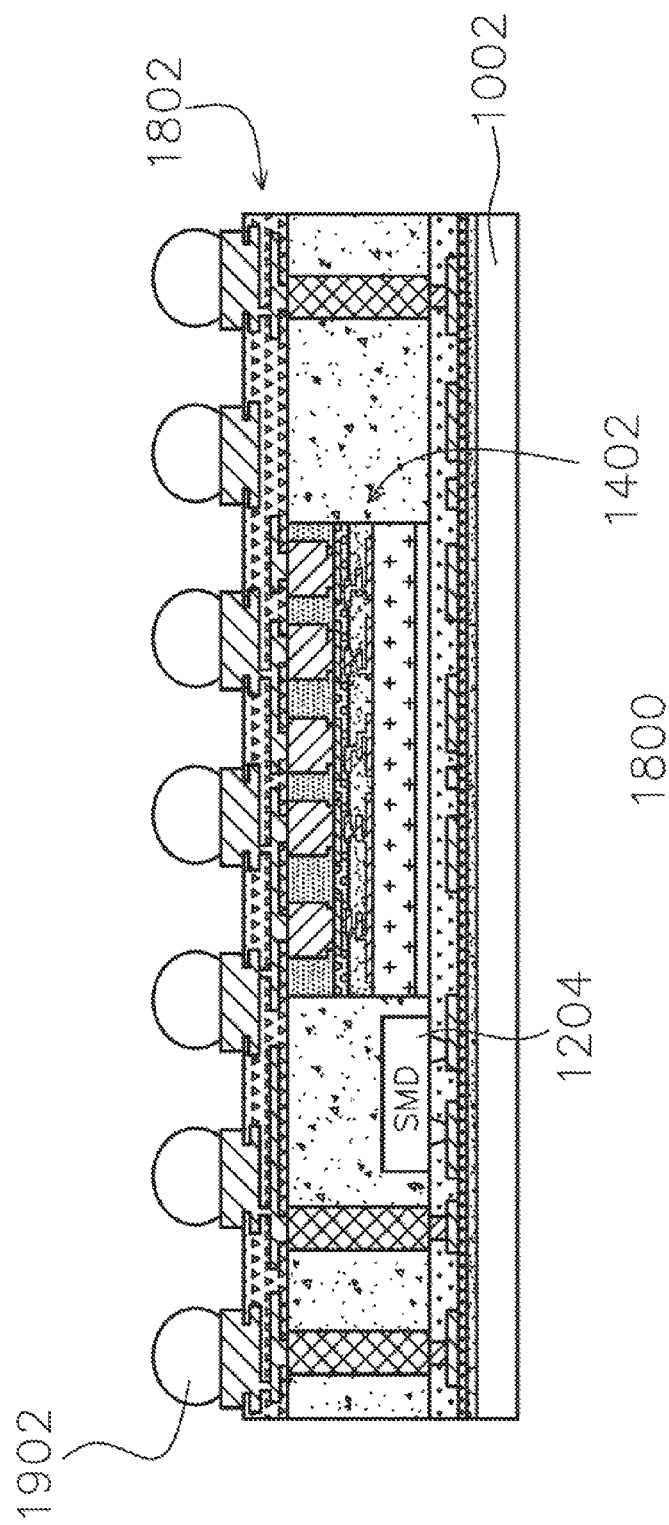

FIG. 19 is a sectional view illustrating the exemplary semiconductor package in accordance with some embodiments. As shown in FIG. 19, a plurality of metal bumps 1902 are provided and connected to the chip 1402 and the SMD component 1204 by the front redistribution layer 1802. Furthermore, the semiconductor package 1800 is debonded from the carrier 1002. The semiconductor package 1800 may be provided over and connected to a printed circuit board (not shown).

In the embodiment, the sequence of the processes abovementioned provides an example and does not limit scope of the disclosure. There are other possibilities to realize the semiconductor package and the method of forming the same, such as an alternative sequence which fabricates the via 1702 prior to the molding compound 1502.

FIGS. 20(a), 20(b) are top views illustrating the shape of the pad in the backside redistribution layer of the exemplary semiconductor package and its contact with the SMD component by using solders in accordance with some embodiments. As shown in FIG. 20(a), a pad 2002 with a notch 2003 is provided in the backside redistribution layer. The notch 2003 is designed to define location of the pad 2002. The width of the pad 2002 is about 450 micrometers; the length of the pad 2002 is about 400 micrometers. The width and the length of the notch 2003 are about 2-10 micrometers. As shown in FIG. 20(b), a pre-solder 2006 is placed over the pad 2002 for joining the pad 2002 and an SMD component 2004. The pre-solder 2006 is confined by the notch 2003.

Figure 21A:
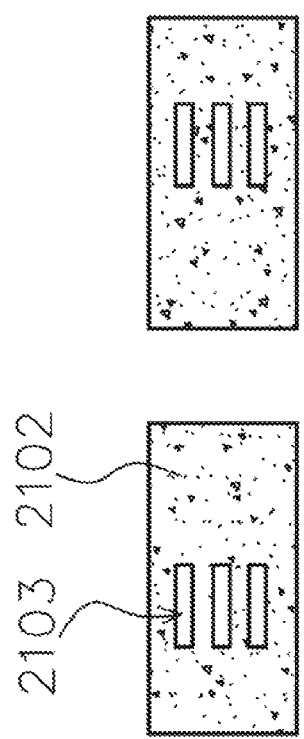
FIGS. 21(*a*), 21(*b*) are top views illustrating the shape of the pad in the backside redistribution layer of the exemplary semiconductor package and its contact with the SMD component by using solders in accordance with some embodiments.
Figure 21B:
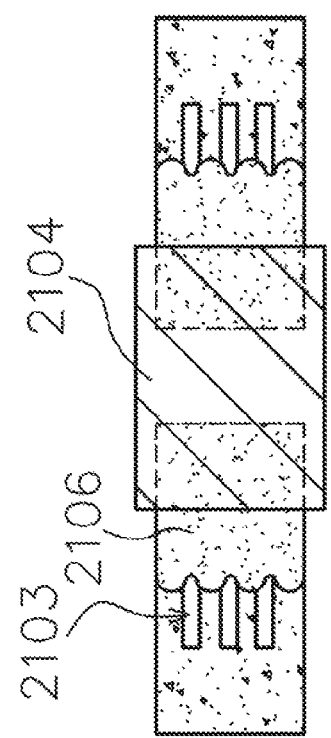

FIGS. 21(a), 21(b) are top views illustrating the shape of the pad in the backside redistribution layer of the exemplary semiconductor package and its contact with the SMD component by using solders in accordance with some embodiments. As shown in FIG. 21(a), a pad 2102 with a slot 2103 is provided in the backside redistribution layer. The slot 2103 is designed to define location of the pad 2102. The width of the pad 2102 is about 450 micrometers; the length of the pad 2102 is about 400 micrometers. The width of the slot 2103 is about 30-60 micrometers; the length of the slot 2103 is about 20 micrometers. The number of the slots is not limited and varies based on pad designs. As shown in FIG. 21(b), a pre-solder 2106 is placed over the pad 2102 for joining the pad 2102 and an SMD component 2104. The pre-solder 2106 is confined by the slot 2103. Additionally, different shapes of the slots can be applied for stopping solder wetting expansion.

Figure 22A:
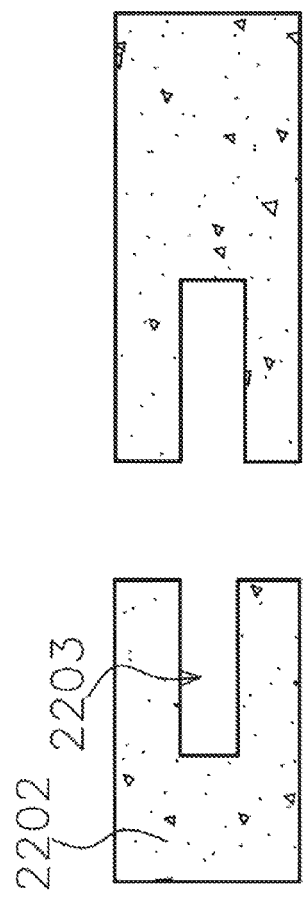
FIGS. 22(*a*), 22(*b*) are top views illustrating the shape of the pad in the backside redistribution layer of the exemplary semiconductor package and its contact with the SMD component by using solders in accordance with some embodiments.
Figure 22B:
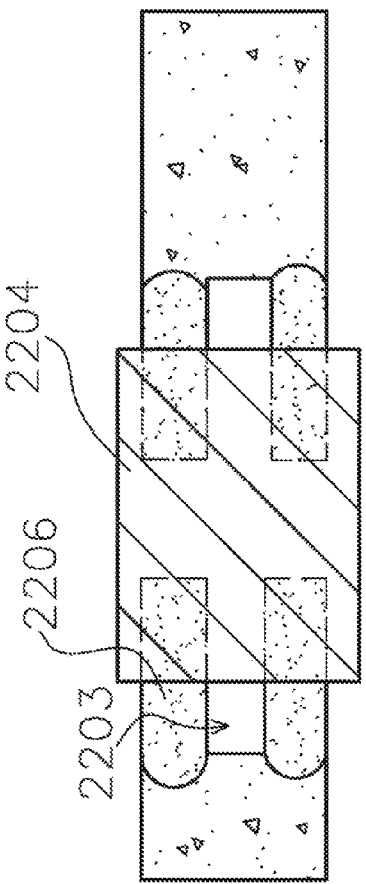

FIGS. 22(a), 22(b) are top views illustrating the shape of the pad in the backside redistribution layer of the exemplary semiconductor package and its contact with the SMD component by using solders in accordance with some embodiments. As shown in FIG. 22(a), a u-shape pad 2202 with a open structure 2203 is provided in the backside redistribution layer. The open structure 2203 is designed to define location of the u-shape pad 2202. The width of the open structure 2203 is about 450 micrometers; the length of the open structure 2203 is about 50 micrometers. As shown in FIG. 22(b), a pre-solder 2206 is placed over the u-shape pad 2202 to join the u-shape pad 2202 and an SMD component 2204. By using the open structure 2203, the molding material can flow into the space under the SMD component 2204.

FIGS. 23, 24 are top views illustrating the shape of the pad in the backside redistribution layer of the exemplary semiconductor package in accordance with some embodiments. In order to stop solder wetting expand, different shapes and combinations of the slots can be applied, such as a pad 2302 having three aligned slots in FIG. 23, and even a pad 2402 having four slots in FIG. 24.

Figure 25:
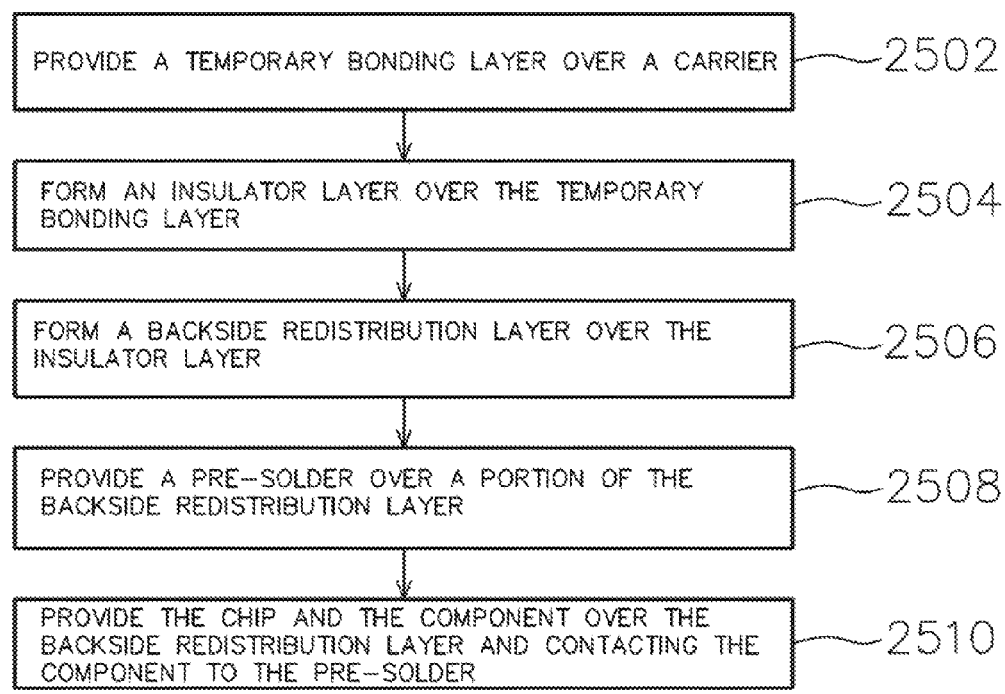
FIG. 25 is a flow chart for a method of forming a semiconductor package comprising a chip and a component in accordance with some embodiments.

FIG. 25 is a flow chart for a method of forming a semiconductor package comprising a chip and a component in accordance with some embodiments. As shown in FIG. 25, a method 2500 is provided. The method 2500 includes the following operations: providing a temporary bonding layer over a carrier (2502); forming an insulator layer over the temporary bonding layer (2504); forming a backside redistribution layer over the insulator layer (2506); providing a pre-solder over a portion of the backside redistribution layer (2508); providing the chip and the component over the backside redistribution layer and contacting the component to the pre-solder (2510).

The operation 2506 further includes forming a pad having a notch in the backside redistribution layer. The operation 2506 further includes forming a pad having a slot in the backside redistribution layer. The operation 2506 further includes forming a u-shape pad having a open structure in the backside redistribution layer. The method 2500 further includes providing a plurality of metal bumps connected to the chip and the component by the front redistribution layer. The method 2500 further includes: providing a molding compound over the component and adjacent to the chip; opening a via hole in the molding compound; providing a via in the via hole of the molding compound; and providing a front redistribution layer over the chip and the via to connect the chip and the component by using the backside redistribution layer, the via and the front redistribution layer; debonding the semiconductor package from the carrier; and providing the semiconductor package over and connected to a printed circuit board. The operation 2510 further includes providing a surface-mount device (SMD) over the backside redistribution layer. The operation 2504 further includes forming the insulator layer made of polymer over the temporary bonding.

Figure 26:
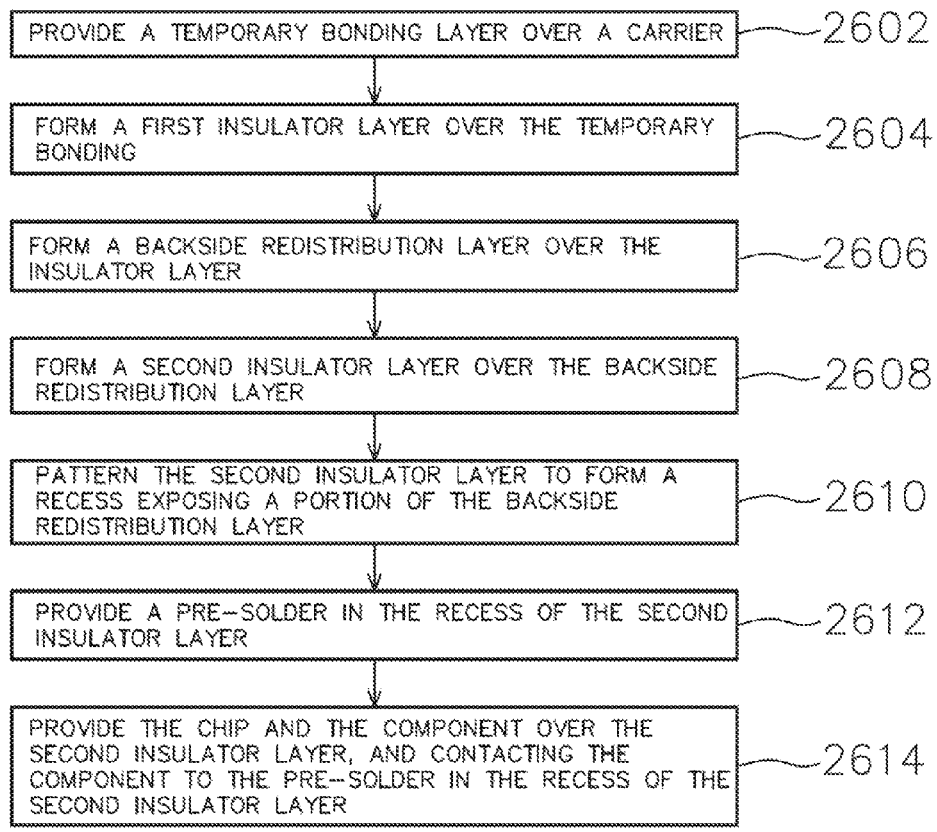
FIG. 26 is a flow chart for a method of forming a semiconductor package comprising a chip and a component in accordance with some embodiments.

FIG. 26 is a flow chart for a method of forming a semiconductor package comprising a chip and a component in accordance with some embodiments. As shown in FIG. 26, a method 2600 is provided. The method 2600 includes the following operations: providing a temporary bonding layer over a carrier (2602); forming a first insulator layer over the temporary bonding (2604); forming a backside redistribution layer over the insulator layer (2606); forming a second insulator layer over the backside redistribution layer (2608); patterning the second insulator layer to form a recess exposing a portion of the backside redistribution layer (2610); providing a pre-solder in the recess of the second insulator layer (2612); providing the chip and the component over the second insulator layer, and contacting the component to the pre-solder in the recess of the second insulator layer (2614).

The operation 2606 further includes forming a pad having a notch in the backside redistribution layer. The operation 2606 further includes forming a pad having a slot in the backside redistribution layer. The operation 2606 further includes forming a u-shape pad having a open structure in the backside redistribution layer. The method 2600 further includes providing a plurality of metal bumps connected to the chip and the component by the front redistribution layer. The method 2600 further includes: providing a molding compound over the component and adjacent to the chip; opening a via hole in the molding compound and the second insulator layer; providing a via in the via hole of the molding compound and the second insulator layer; and providing a front redistribution layer over the chip and the via to connect the chip and the component by using the backside redistribution layer, the via and the front redistribution layer; debonding the semiconductor package from the carrier; and providing the semiconductor package over and connected to a printed circuit board. The operation 2614 further includes providing a surface-mount device (SMD) over the second insulator layer.

According to an exemplary embodiment, a method of forming a semiconductor package comprising a chip and a component is provided. The method includes the following operations: providing a temporary bonding layer over a carrier; forming a first insulator layer over the temporary bonding; forming a backside redistribution layer over the insulator layer; forming a second insulator layer over the backside redistribution layer; patterning the second insulator layer to form a recess exposing a portion of the backside redistribution layer; providing a pre-solder in the recess of the second insulator layer; providing the chip and the component over the second insulator layer, and contacting the component to the pre-solder in the recess of the second insulator layer.

According to an exemplary embodiment, a method of forming a semiconductor package comprising a chip and a component is provided. The method includes the following operations: providing a temporary bonding layer over a carrier; forming an insulator layer over the temporary bonding layer; forming a backside redistribution layer over the insulator layer; providing a pre-solder over a portion of the backside redistribution layer; providing the chip and the component over the backside redistribution layer and contacting the component to the pre-solder.

According to an exemplary embodiment, a semiconductor package is provided. The semiconductor package includes: a backside redistribution layer; at least one component, disposed over and connected to the backside redistribution layer; at least one chip adjacent to the at least one component; a molding compound disposed between the at least one chip and the at least one component; a via, disposed in the molding compound and connected to the backside redistribution layer; and a front redistribution layer, disposed over the chip and the via, wherein the chip and the at least one component are connected by using the backside redistribution layer, the via and the front redistribution layer.

FIG. 27 is a sectional view illustrating an exemplary semiconductor package in accordance with some embodiments. As shown in FIG. 27, a temporary bonding layer 2704 is coated over a carrier 2702. The carrier 2702 may be formed of, for example, metal or glass. The temporary bonding layer 2704 is formed of, for example, glue. The thickness of the temporary bonding layer 2704 may be about 1 micrometers.

An insulator layer 2706 is formed over the temporary bonding layer 2704. The insulator layer 2706 may be formed of, for example, epoxy or polymer. For each of the redistribution layer (not shown), the thickness of the insulator layer 2706 may be about 4 micrometers to 15 micrometers. An adhesive layer 2708 is formed over the insulator layer 2706. The adhesive layer 2708 may be formed of, for example, polymer. The thickness of the adhesive layer 2708 may be about 10 micrometers to 50 micrometers. A chip 2710 is provided over the adhesive layer 2708. The chip 2710 adheres to insulator layer 2706 by the adhesive layer 2708. In the embodiments, the chip 2710 may be selected from the group consisting of silicon semiconductors or III-V semiconductors. The chip 2710 may include a microelectromechanical system (MEMS). The thickness of the chip 2710 may be about 50 micrometers to 500 micrometers.

Joint pads 2712, pillars 2714, and vias 2716 made of metallic materials are formed over the chip 2710. In an embodiment, joint pads 2712, pillars 2714, and vias 2716 are made of metallic materials containing copper (Cu). The thickness of the joint pads 2712 may be about 1 micrometers to 8 micrometers. The width of the joint pads 2712 may be about 20 micrometers to 400 micrometers. The thickness of the pillars 2714 may be about 70 micrometers to 200 micrometers. The width of the pillars 2714 may be about 50 micrometers to 300 micrometers. The thickness of the vias 2716 may be about 100 micrometers to 250 micrometers. The width of the vias 2716 may be about 80 micrometers to 300 micrometers.

FIG. 28 is a sectional view illustrating an exemplary semiconductor package in accordance with some embodiments. As shown in FIG. 28, an integrated passive device (IPD) component 2806 with metal caps 2802 and metal bumps 2804 are provided over the joint pads 2712. In an embodiment, the metal bumps 2804 are made of copper or copper-containing alloys. In an embodiment, the metal caps 2802 are made of solder, nickel, gold, copper or alloys thereof. The thickness of the metal caps 2802 may be about 10 micrometers to 20 micrometers. The thickness of the metal bumps 2804 may be about 20 micrometers. The IPD component 2806 electrically connects to the chip 2710 through the metal caps 2802, the metal bumps 2804, and the joint pads 2712. The thickness of the IPD component 2806 may be about 100 micrometers to 300 micrometers. An underfill 2808 surrounds the joint pads 2712, the solder caps 2802, and the metal bumps 2804 of the IPD component 2806.

FIG. 29 is a sectional view illustrating an exemplary semiconductor package in accordance with some embodiments. As shown in FIG. 29, a molding compound 2902 is overmolded onto the IPD component 2806 and adjacent to the chip 2710 and the underfill 2808. The molding compound 2902 at least covers the top of the IPD component 2806, the top of the pillars 2714, and the top of the vias 2716. The thickness of the molding compound 2902 may be about 200 micrometers to 350 micrometers. The material of the molding compound 2902 may be, for example, epoxy.

FIG. 30 is a sectional view illustrating an exemplary semiconductor package in accordance with some embodiments. As shown in FIG. 30, a grinding process is performed on the molding compound 2902, the IPD component 2806, the pillars 2714, and the vias 2716 so as to produce a grinded surface 3002 on the top side of the IPD component 2806. The grinding process reduces the thickness of the molding compound 2902, the thickness of the IPD component 2806, the thickness of the pillars 2714, and the thickness of the vias 2716. For example, the thickness of the IPD component 2806 is reduced from about 100 micrometers to 50 micrometers. As such, instead of picking and placing a thin IPD component (e.g., 50 micrometers) over the chip 2710, the disclosure picks and places a thicker IPD component (e.g., 100 micrometers) over the chip 2710 and further grinds the IPD component to a thinner one (e.g., 50 micrometers). The disclosure overcomes the issue of handling the thin IPD component that is easily damaged during picking and placing. Additionally, short distance between the IPD component 2806 and the chip 2710 will result in better electric performance without reliability trade-off.

Figure 31:
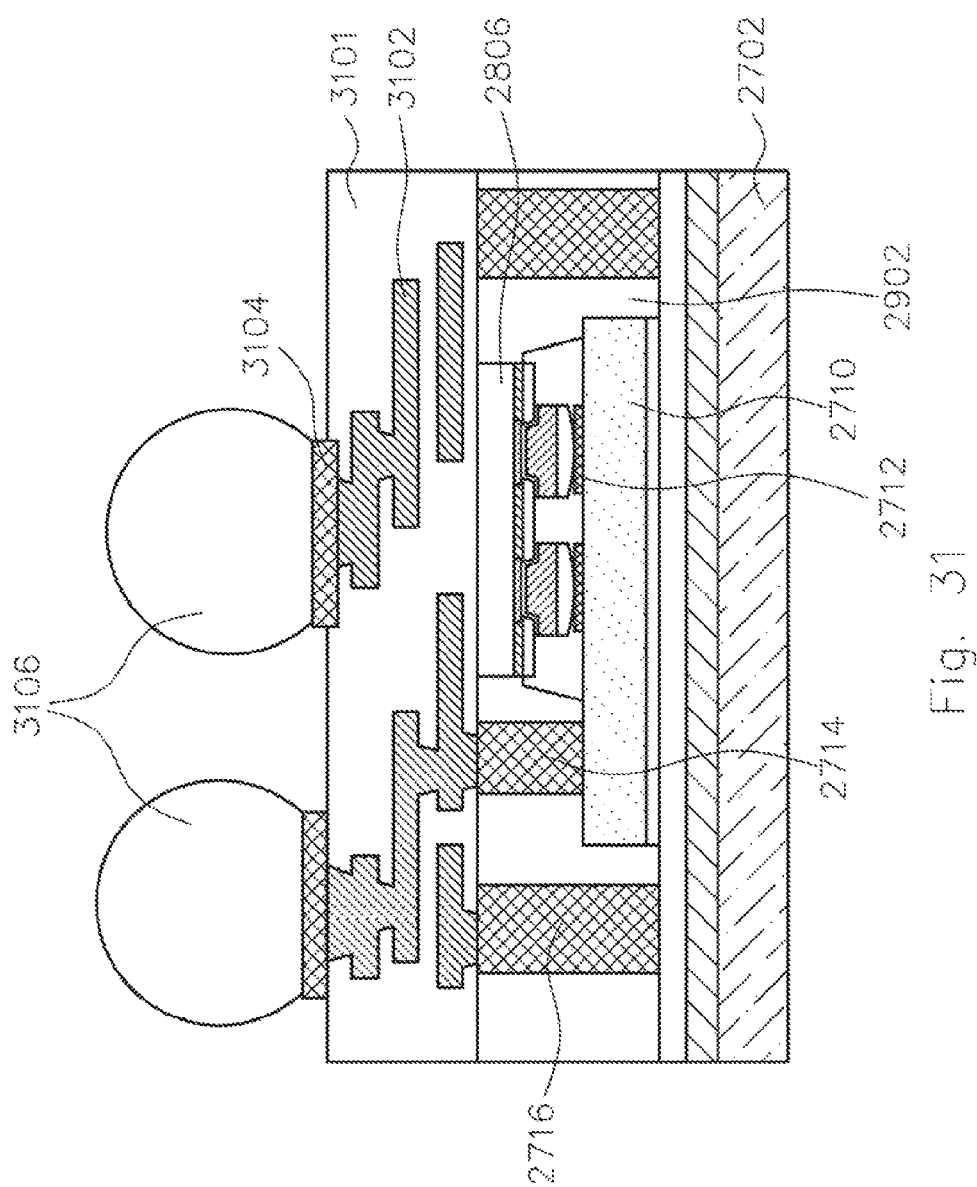

FIG. 31 is a sectional view illustrating the exemplary semiconductor package in accordance with some embodiments. As shown in FIG. 31, a front redistribution layer 3102 is provided in an insulator layer 3101 over the IPD component 2806, the pillar 2714, and the via 2716. The chip 2710 connects to the front redistribution layer 3102 through the pillar 2714. The material for the front redistribution layer 3102 may comprise, but is not limited to, for example Cu, Al, AlCu, Al alloy, Cu alloy, or other conductive materials. Metal bumps 3106 connects to the front redistribution layer 3102 through an under bump metal (UBM) 3104. The formation of the metal bumps 3106 on the front redistribution layer 3102 may be realized by, for example, ball grid array (BGA) solder bumping, which is a type of surface-mount packaging. The IPD components 2806 are placed in the molding compound 2902 and connect to the chip 2710 through the joint pad 2712. The IPD components 2806 are not placed between the metal bumps 3106. Therefore, the IPD components 2806 are no longer constrained by a height which is less than the stand-off-height of the metal bumps 3106.

In the embodiment, the sequence of the processes above-mentioned provides an example and does not limit scope of the disclosure. There are other possibilities to realize the semiconductor package and the method of forming the same, such as an alternative sequence which fabricates the via 2716 prior to the molding compound 2902.

Figure 32:
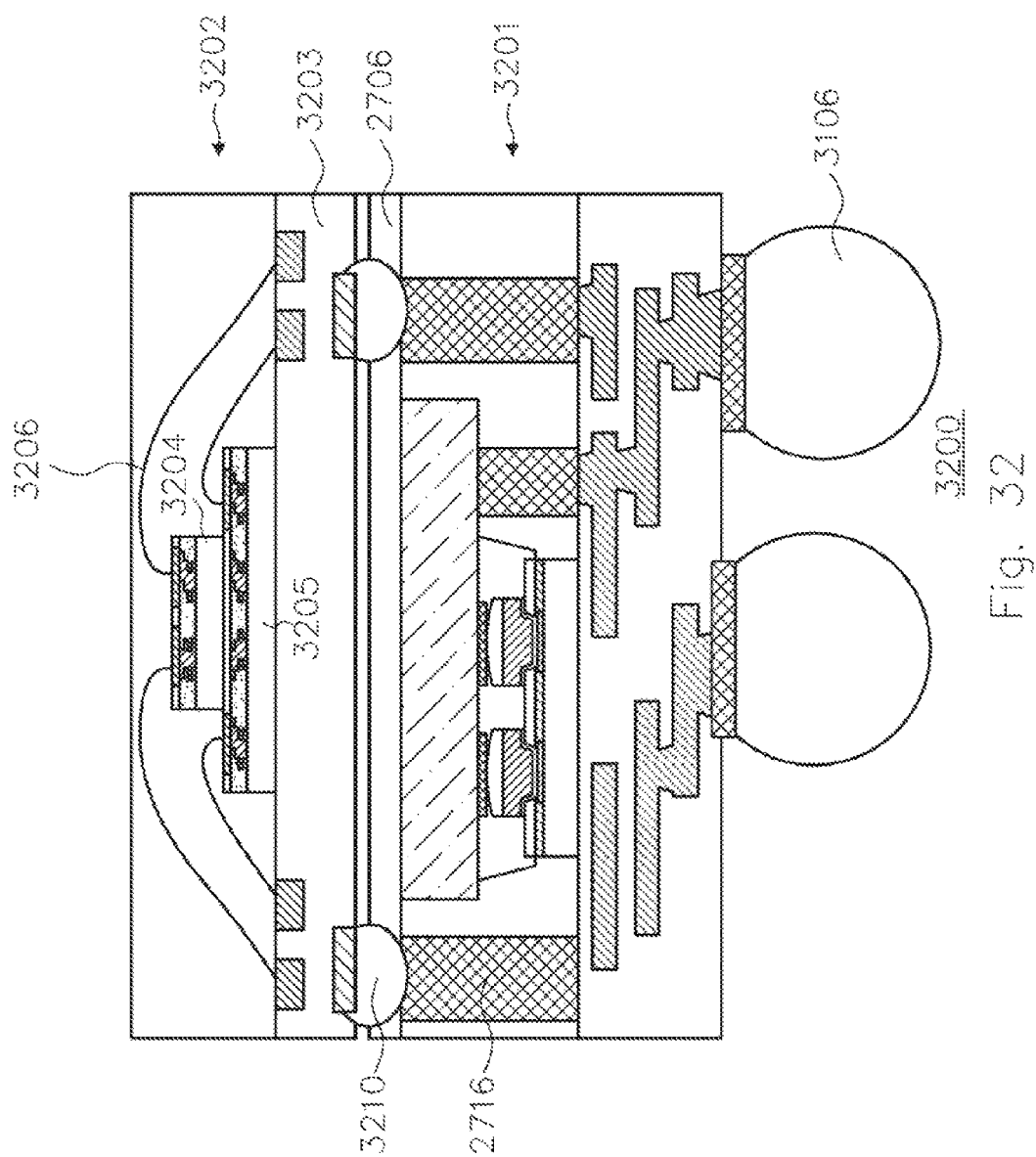

FIG. 32 is a sectional view illustrating the exemplary semiconductor package in accordance with some embodiments. As shown in FIG. 32, a semiconductor package 3201 is debonded from the carrier 2702 in FIG. 31. The insulator layer 2706 of the semiconductor package 3201 is opened. The semiconductor package 3201 is flipped upside down and connects to another semiconductor package 3202. In the embodiment, the semiconductor package 3202 includes two stacked mobile DDRs (or LPDDR) 3204, 3205 and a packaging substrate 3203. The packaging substrate 3203 includes a redistribution layer (not shown), and connects to the two chips 3204, 3205 through bonding wires 3206. For example, the two chips 3204, 3205 are mobile DDRs. Metal bumps 3210 provide electrical connection between the vias 2716 and the packaging substrate 3203. Therefore, a package-on-package structure 3200 including the semiconductor packages 3201, 3202 is provided.

Figure 33:
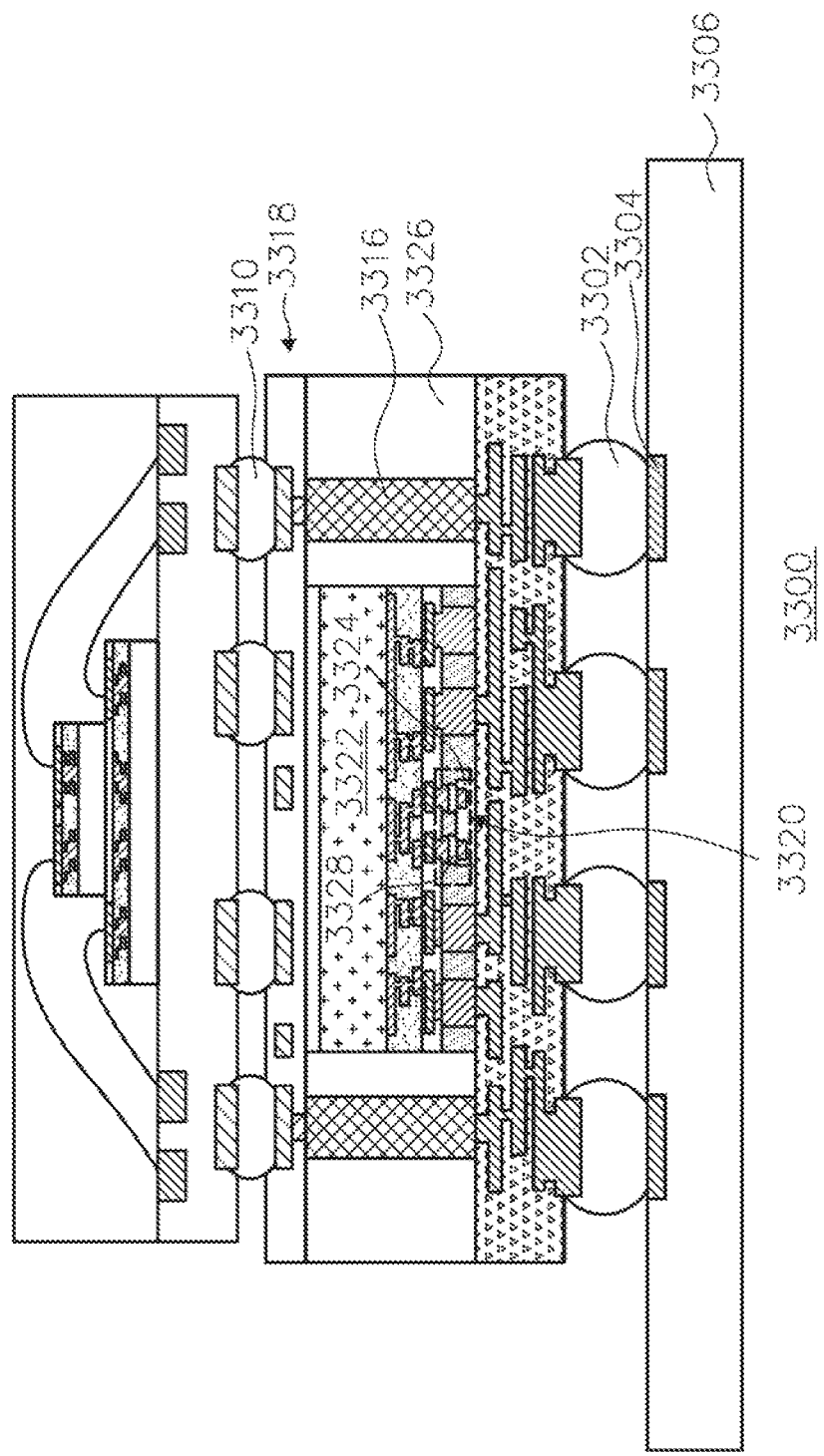
FIG. 33 is sectional view illustrating an exemplary semiconductor package in accordance with some embodiments.

FIG. 33 is a sectional view illustrating another exemplary semiconductor package in accordance with some embodiments. As shown in FIG. 33, a package-on-package structure 3300 similar to the structure 3200 is provided. Compared to FIG. 32, the package-on-package structure 3300 further includes a printed circuit board 3306 having a redistribution layer 3304. Additionally, metal bumps 3310 connects to vias 3316 through another redistribution layer 3318. Also, a connection structure 3320 between an IPD component 3324 and a chip 3322 does not utilize any underfill, and a molding compound 3326 surrounds metal caps 3328.

Figure 34:
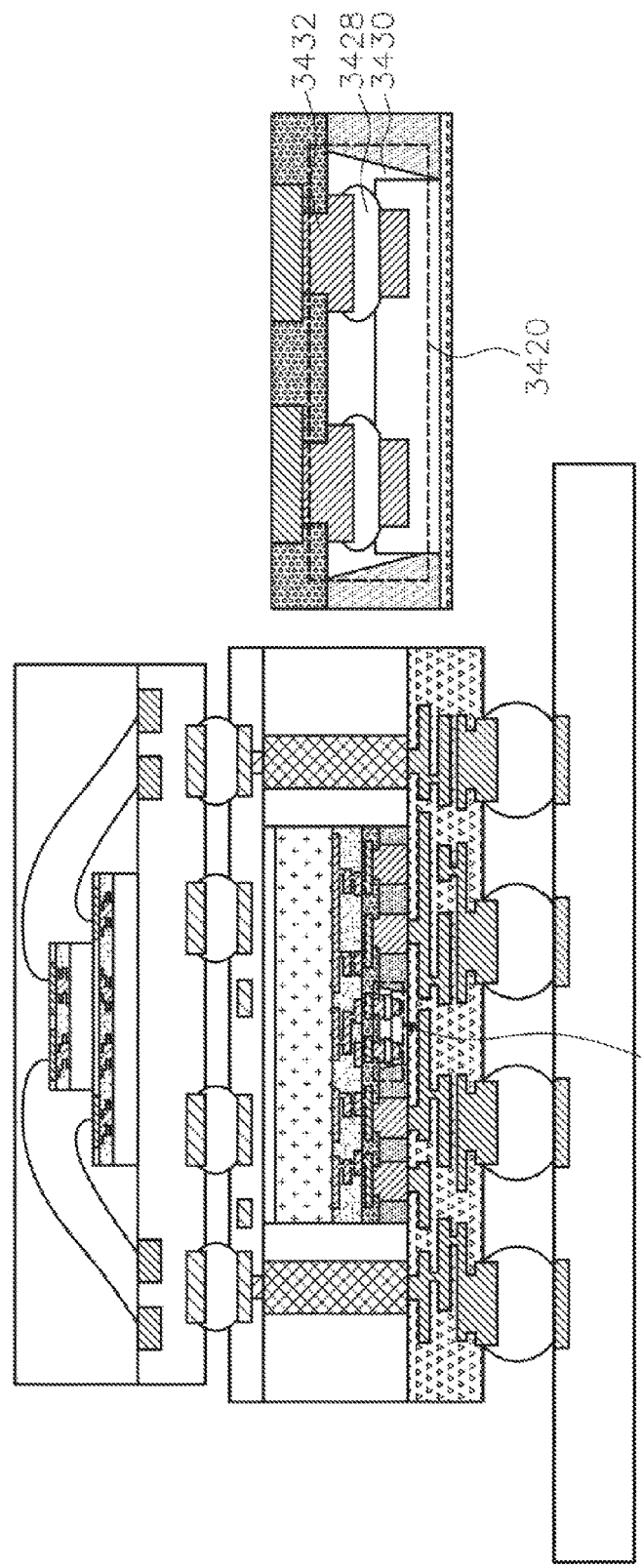
FIG. 34 is sectional view illustrating an exemplary semiconductor package in accordance with some embodiments.

FIG. 34 is a sectional view illustrating another exemplary semiconductor package in accordance with some embodiments. As shown in FIG. 34, another package-on-package structure 3400 similar to the structure 3300 is provided. The package-on-package structure 3400 differentiates from the structure 3300 by a connection structure 3420 with an underfill 3430. The connection structure 3420 includes the underfill 3430 surrounding metal caps 3428 and joint pads 3432.

Figure 35:
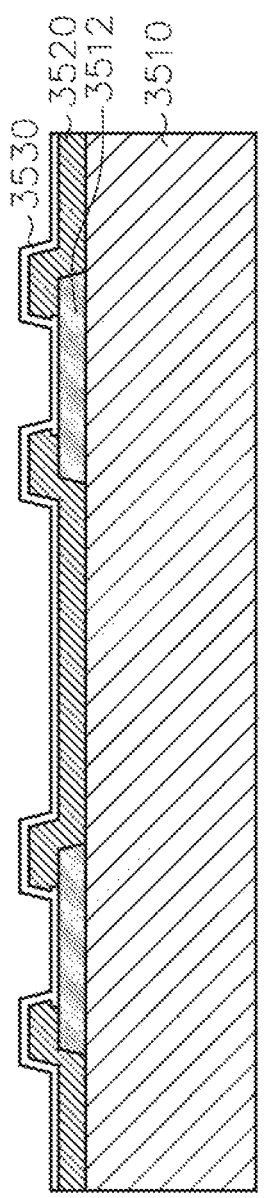
FIGS. 35-38 are sectional views illustrating a connection between a chip and an IPD component of an exemplary semiconductor package in accordance with some embodiments.

FIG. 35 is a sectional view illustrating a connection between a chip and an IPD component of an exemplary semiconductor package in accordance with some embodiments. As shown in FIG. 35, a chip 3510 having an I/O pad 3512 is provided. The chip 3510 may be selected from the group consisting of silicon semiconductors or III-V semiconductors. The chip 3510 may include a microelectromechanical system (MEMS). An insulation layer 3520 made of polymer is formed over the chip 3510 and the I/O pad 3512. Then, a seed metal layer 3530 is sputtered on the insulation layer 3520. The seed metal layer 3530 may be made of Ti or Cu.

Figure 36:
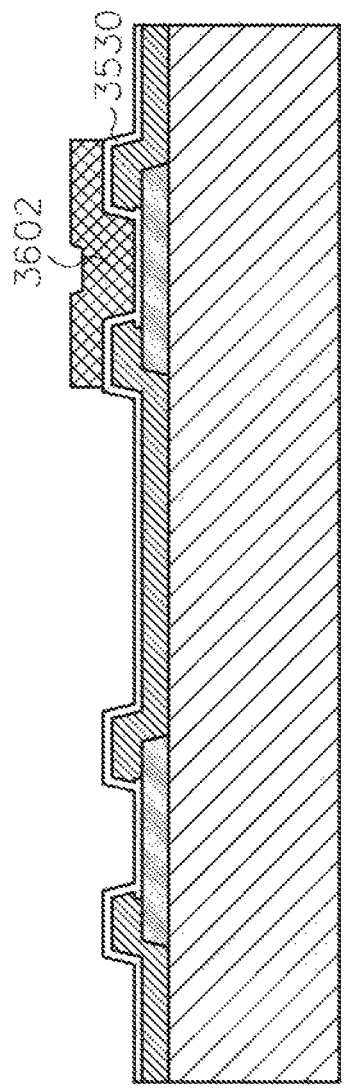

FIG. 36 is a sectional view illustrating a connection between a chip and an IPD component of an exemplary semiconductor package in accordance with some embodiments. As shown in FIG. 36, a joint pad 3602 is formed over the seed metal layer 3530. The formation of the joint pad 3602 may includes photoresist coating, photoresist exposure, electroplating, and stripping. The thickness of the joint pad 3602 may be about 4 micrometers.

Figure 37:
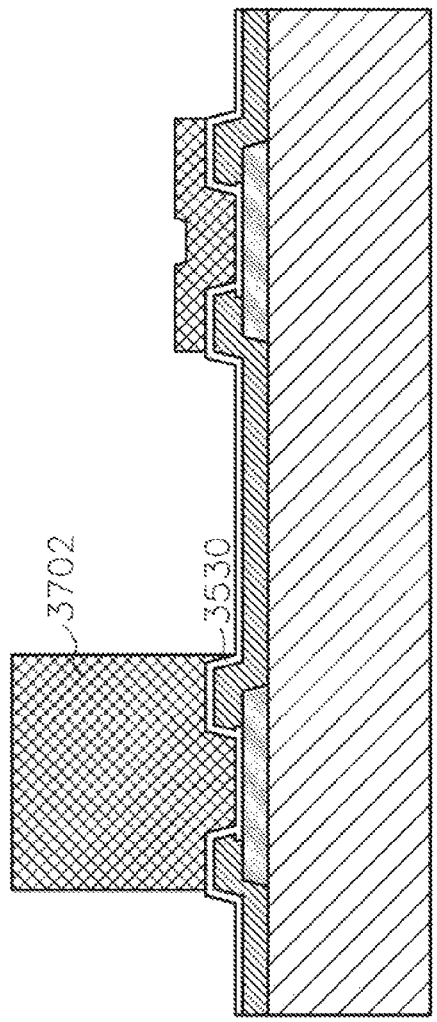

FIG. 37 is a sectional view illustrating a connection between a chip and an IPD component of an exemplary semiconductor package in accordance with some embodiments. As shown in FIG. 37, a I/O pillar 3702 is formed over the seed metal layer 3530. The formation of the I/O pillar 3702 may includes dry photoresist coating, photoresist exposure, electroplating, and stripping. The thickness of the I/O pillar 3702 may be about 90 micrometers.

Figure 38:
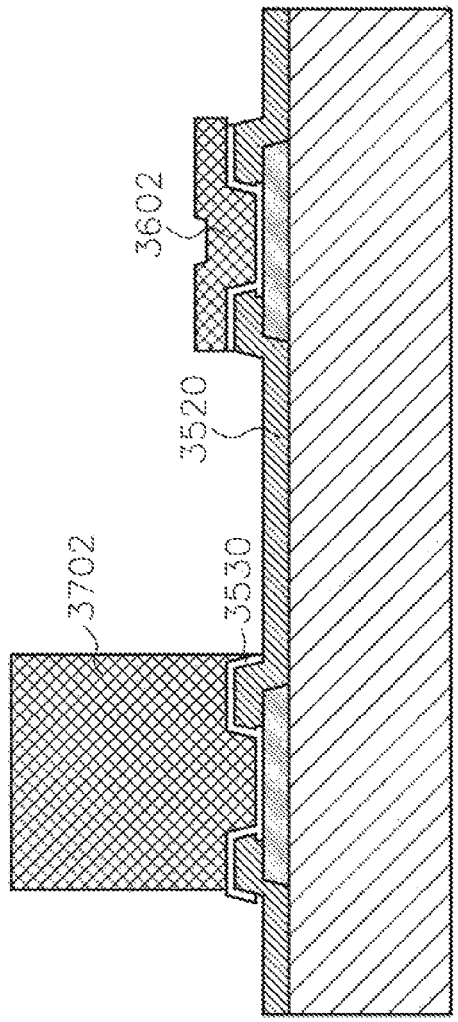

FIG. 38 is a sectional view illustrating a connection between a chip and an IPD component of an exemplary semiconductor package in accordance with some embodiments. As shown in FIG. 38, portions of the seed metal layer 3530 except for those covered by the joint pad 3602 and the I/O pillar 3702 are removed so that the insulation layer 3520 is exposed. The following steps starting from FIG. 28 may be performed on a connection structure 3800 in FIG. 38.

Figure 39:
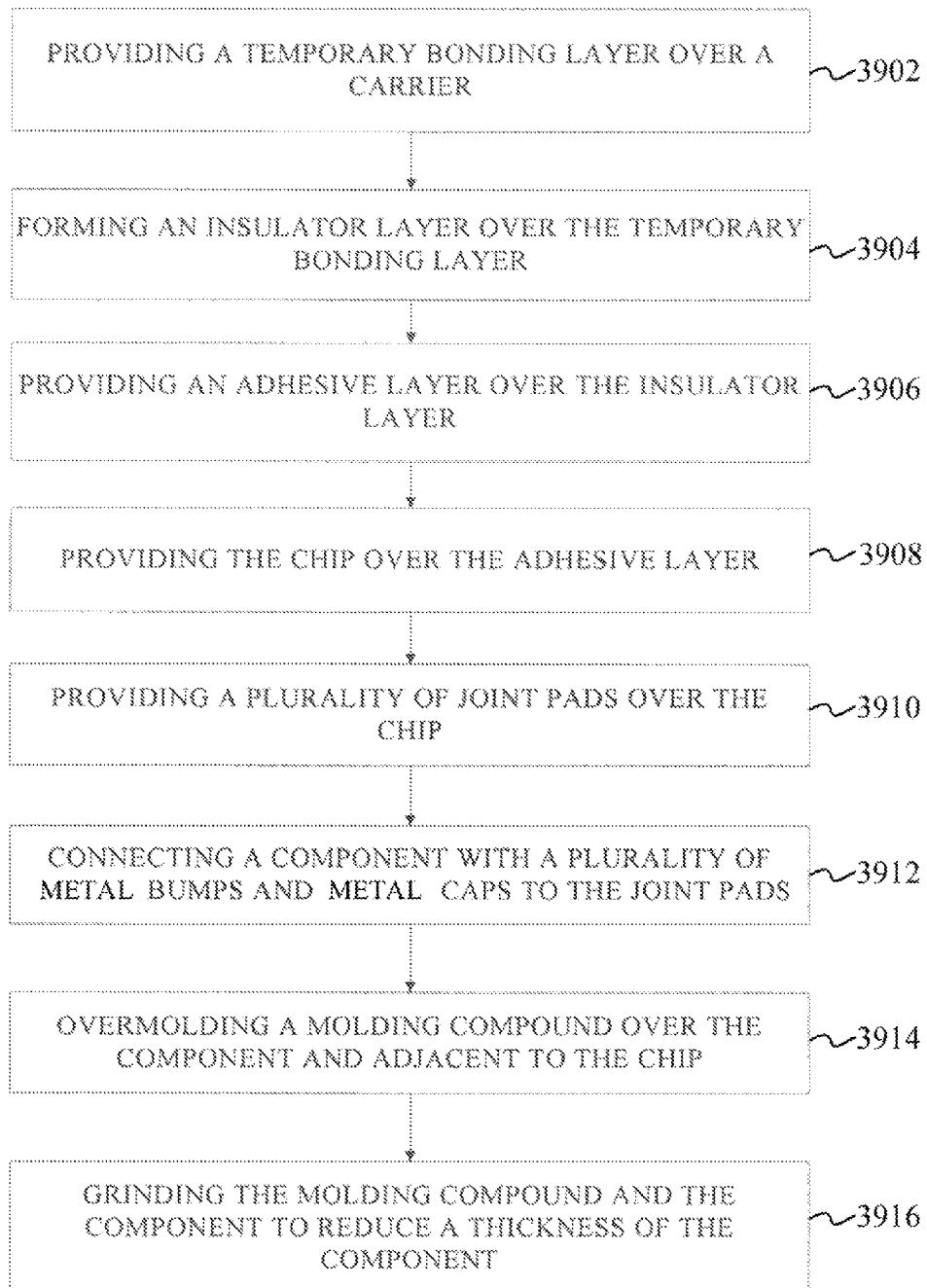
FIG. 39 is a flow chart for a method of forming a semiconductor package comprising a chip and a component in accordance with some embodiments.

FIG. 39 is a flow chart for a method of forming a semiconductor package comprising a chip and a component in accordance with some embodiments. As shown in FIG. 39, a method 3900 is provided. The method 3900 includes the following operations: providing a temporary bonding layer over a carrier (3902); forming an insulator layer over the temporary bonding layer (3904); providing an adhesive layer over the insulator layer (3906); providing the chip over the adhesive layer (3908); providing a plurality of joint pads over the chip (3910); connecting the component with a plurality of metal bumps and metal caps to the joint pads (3912); overmolding a molding compound over the component and adjacent to the chip (3914); and grinding the molding compound and the component to reduce a thickness of the component (3916).

Figure 40:
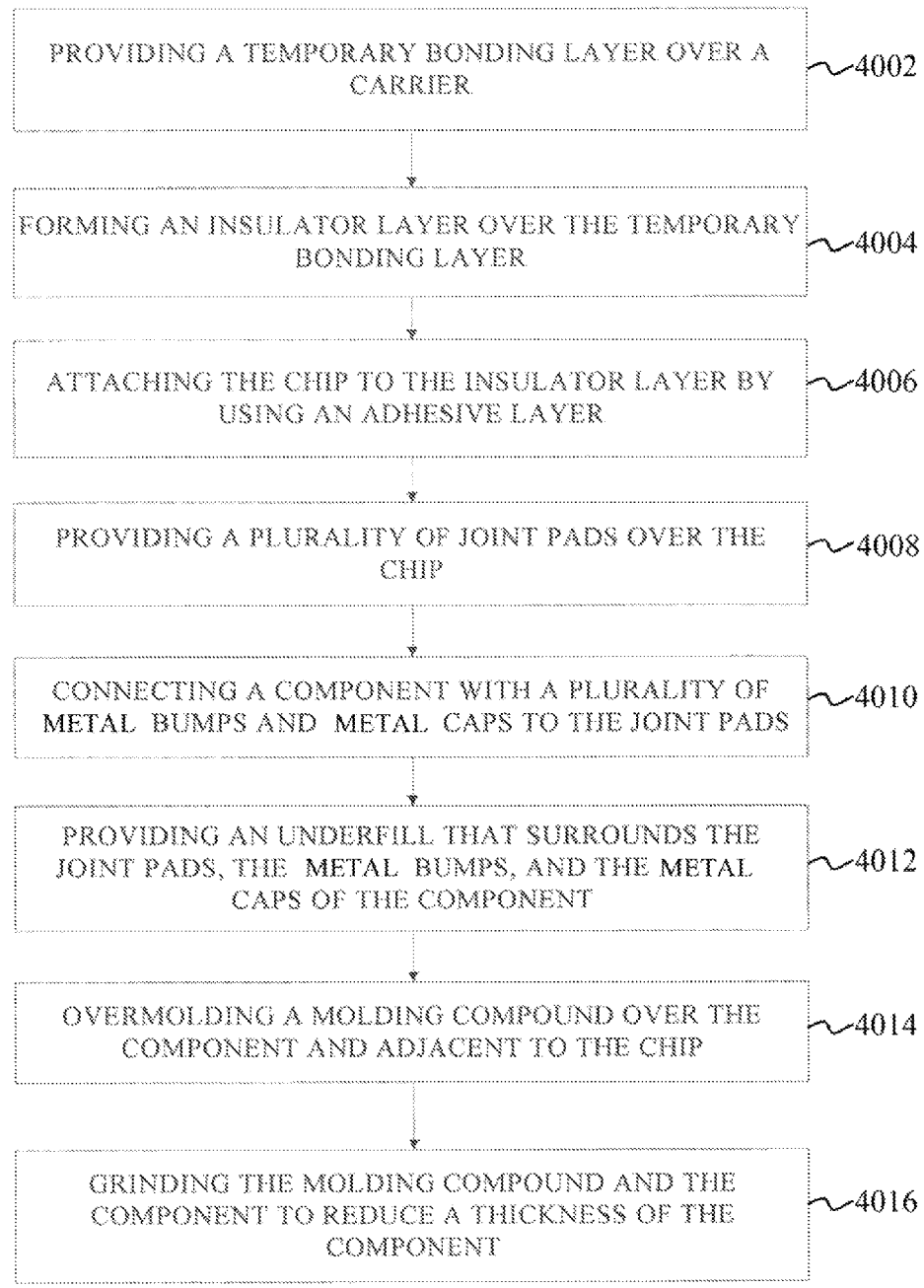
FIG. 40 is a flow chart for a method of forming a semiconductor package comprising a chip and a component in accordance with some embodiments.

FIG. 40 is a flow chart for a method of forming a semiconductor package comprising a chip and a component in accordance with some embodiments. As shown in FIG. 40, a method 4000 is provided. The method 4000 includes the following operations: providing a temporary bonding layer over a carrier (4002); forming an insulator layer over the temporary bonding layer (4004); attaching the chip to the insulator layer by using an adhesive layer (4006); providing a plurality of joint pads over the chip (4008); connecting the component with a plurality of metal bumps and metal caps to the joint pads (4010); providing an underfill that surrounds the joint pads, the metal bumps, and the metal caps of the component (4012); overmolding a molding compound over the component and adjacent to the chip (4014); and grinding the molding compound and the component to reduce a thickness of the component (4016).

According to an exemplary embodiment, a method of forming a semiconductor package comprising a chip and a component is provided. The method includes the following operations: providing a temporary bonding layer over a carrier; forming an insulator layer over the temporary bonding layer; providing an adhesive layer over the insulator layer; providing the chip over the adhesive layer; providing a plurality of joint pads over the chip; connecting a component with a plurality of metal bumps and metal caps to the joint pads; overmolding a molding compound over the component and adjacent to the chip; and grinding the molding compound and the component to reduce a thickness of the component.

According to an exemplary embodiment, a method of forming a semiconductor package comprising a chip and a component is provided. The method includes the following operations: providing a temporary bonding layer over a carrier; forming an insulator layer over the temporary bonding layer; attaching the chip to the insulator layer by using an adhesive layer; providing a plurality of joint pads over the chip; connecting a component with a plurality of metal bumps and metal caps to the joint pads; providing an underfill that surrounds the joint pads, the metal bumps, and the metal caps of the component; overmolding a molding compound over the component and adjacent to the chip; and grinding the molding compound and the component to reduce a thickness of the component.

According to an exemplary embodiment, a semiconductor package is provided. The semiconductor package includes: a chip having a plurality of joint pads; a component having a plurality of metal caps on one side and having a grinded surface on the other side, wherein the metal caps are in contact with the joint pads of the chip.

According to an exemplary embodiment, a semiconductor package is provided. The semiconductor package includes: a chip having a plurality of joint pads; a plurality of pillars connected to the chip; a component having a plurality of metal caps in contact with the joint pads of the chip; and a redistribution layer connected to the chip through the pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package comprising a chip and a component, comprising:
   providing a temporary bonding layer over a carrier;
   forming an insulator layer over the temporary bonding layer;
   providing an adhesive layer over the insulator layer;
   providing the chip over the adhesive layer;
   providing a plurality of joint pads over the chip;
   connecting the component with a plurality of metal bumps and metal caps to the joint pads;
   overmolding a molding compound over the component and adjacent to the chip; and
   grinding the molding compound and the component to reduce a thickness of the component.

2. The method of claim 1, further comprising:
   providing a pillar over the chip;
   overmolding the molding compound over the pillar; and
   grinding the molding compound to expose the pillar.

3. The method of claim 2, further comprising providing a redistribution layer connected to the pillar.

4. The method of claim 1, wherein connecting the component with the metal bumps and the metal caps to the joint pads further comprises picking and placing the component over the joint pads.

5. The method of claim 1, wherein connecting the component with the metal bumps and the metal caps to the joint pads further comprises connecting an integrated passive device to the joint pads.

6. The method of claim 1, wherein forming the insulator layer over the temporary bonding layer further comprises forming the insulator layer made of polymer over the temporary bonding.

7. The method of claim 1, further comprising providing an underfill that surrounds the joint pads, the metal bumps, and the metal caps of the component.

8. The method of claim 1, wherein connecting the component with the meta bumps and the metal caps to the joint pads further comprises providing the component having the thickness of about 100 micrometers to 300 micrometers.

9. The method of claim 1, wherein grinding the molding compound and the component to reduce the thickness of the component further comprises reducing the thickness of the component to about 30 micrometers to 80 micrometers.

10. The method of claim 1, further comprising connecting a stacked memory package to the chip through ball grid array metal bumps.

11. A method of forming a semiconductor package comprising a chip and a component, comprising:
    providing a temporary bonding layer over a carrier;
    forming an insulator layer over the temporary bonding layer;
    providing an adhesive layer over the insulator layer;
    providing the chip having a plurality of joint pads;
    electrically connecting the component having a plurality of metal caps to the joint pads;
    overmolding a molding compound over the component and adjacent to the chip; and
    grinding the molding compound and the component to reduce a thickness of the component.

12. The method of claim 11, further comprising:
    providing a pillar over the chip;
    overmolding the molding compound over the pillar; and
    grinding the molding compound to expose the pillar.

13. The method of claim 12, further comprising providing a redistribution layer connected to the pillar.

14. The method of claim 11, wherein electrically connecting the component to the joint pads comprises connecting an integrated passive device to the joint pads.

15. The method of claim 11, further comprising providing an underfill that surrounds the joint pads and the metal caps.

16. The method of claim 11, further comprising connecting a stacked memory package to the chip through ball grid array metal bumps.

17. A method of forming a semiconductor package comprising a chip and a component, the method comprising:
    providing a temporary bonding layer over a carrier;
    forming an insulator layer over the temporary bonding layer;
    providing an adhesive layer over the insulator layer;
    providing the chip having a plurality of joint pads;
    forming a pillar on the chip, the pillar having a thickness that is greater than that of the joint pads;
    connecting a component having a plurality of metal caps to joint pads of the plurality of joint pads;
    forming a molding compound over the component and adjacent to the chip;
    grinding the molding compound and the component to reduce a thickness of the component; and
    forming a redistribution layer in an insulator layer, the redistribution layer including a conductive material that is electrically connected to the chip through the pillar.

18. The method of claim 17, wherein a distance between the insulator layer and the chip is equal to the thickness of the pillar.

19. The method of claim 17, wherein the component has the metal caps on one side and a grinded surface on another side.

20. The method of claim 17, further comprising:
    providing an underfill that surrounds the joint pads and the metal caps.

* * * * *